(12) United States Patent
Kusumoto et al.

(10) Patent No.: US 7,679,091 B2
(45) Date of Patent: Mar. 16, 2010

(54) PHOTOELECTRIC CONVERSION ELEMENT HAVING A SEMICONDUCTOR AND SEMICONDUCTOR DEVICE USING THE SAME

(75) Inventors: Naoto Kusumoto, Isehara (JP); Kazuo Nishi, Tochigi (JP); Yuusuke Sugawara, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 148 days.

(21) Appl. No.: 12/078,090

(22) Filed: Mar. 27, 2008

(65) Prior Publication Data
US 2008/0308851 A1    Dec. 18, 2008

(30) Foreign Application Priority Data
Apr. 18, 2007    (JP)    ............................ 2007-108795

(51) Int. Cl.
   *H01L 27/15*    (2006.01)
(52) U.S. Cl. ............................ 257/84; 257/83; 257/93; 257/98; 257/E31.058
(58) Field of Classification Search .................. 257/79, 257/83, 84, 88, 89, 93, 98
See application file for complete search history.

(56) References Cited

U.S. PATENT DOCUMENTS

| | | | |
|---|---|---|---|
| 5,708,471 A * | 1/1998 | Okumura | ..................... 348/301 |
| 6,600,160 B2 * | 7/2003 | Kobayashi et al. | ..... 250/370.14 |
| 6,995,753 B2 | 2/2006 | Yamazaki et al. | |
| 7,180,197 B2 | 2/2007 | Nishi et al. | |
| 7,453,131 B2 * | 11/2008 | Marshall et al. | .............. 257/438 |
| 2006/0186497 A1 | 8/2006 | Nishi et al. | |
| 2008/0001148 A1 | 1/2008 | Nishi et al. | |

FOREIGN PATENT DOCUMENTS

| | | |
|---|---|---|
| JP | 10-051033 | 2/1998 |
| JP | 11-191640 | 7/1999 |
| JP | 2002-062856 | 2/2002 |
| JP | 2004-172603 | 6/2004 |

* cited by examiner

*Primary Examiner*—Wai-Sing Louie
(74) *Attorney, Agent, or Firm*—Eric J. Robinson; Robinson Intellectual Property Law Office, P.C.

(57) ABSTRACT

A semiconductor device, particularly, a photoelectric conversion element having a semiconductor layer is demonstrated. The photoelectric conversion element of the present invention comprises, over a substrate, a photoelectric conversion layer and first and second electrodes which are electrically connected to the photoelectric conversion layer. The photoelectric conversion element further comprises a wiring board over which a third and fourth electrodes are provided. The characteristic point of the present invention is that a bonding layer, which readily forms an alloy with a conductive material, is formed over the first and second electrodes. This bonding layer improves the bonding strength between the first and third electrodes and the second and fourth electrode, which contributes to the prevention of the connection defect between the substrate and the wiring board and consequentially to high reliability of the photoelectric conversion element.

25 Claims, 23 Drawing Sheets

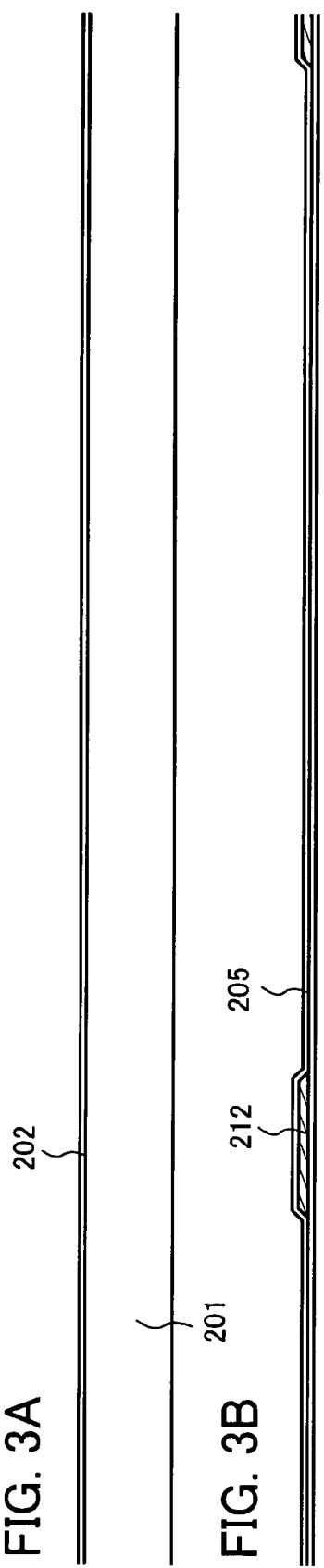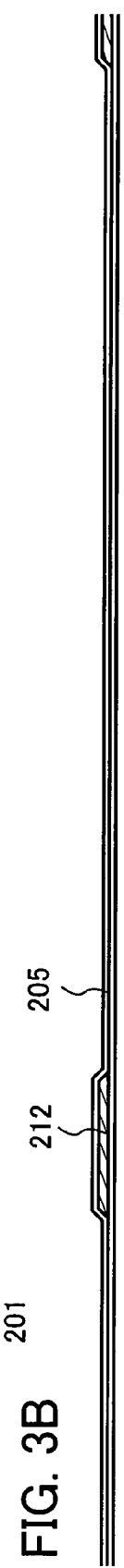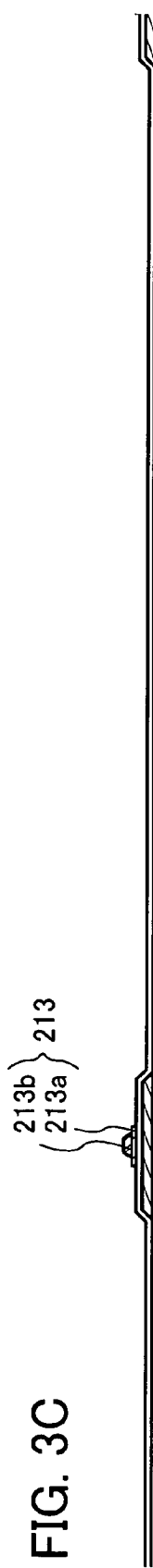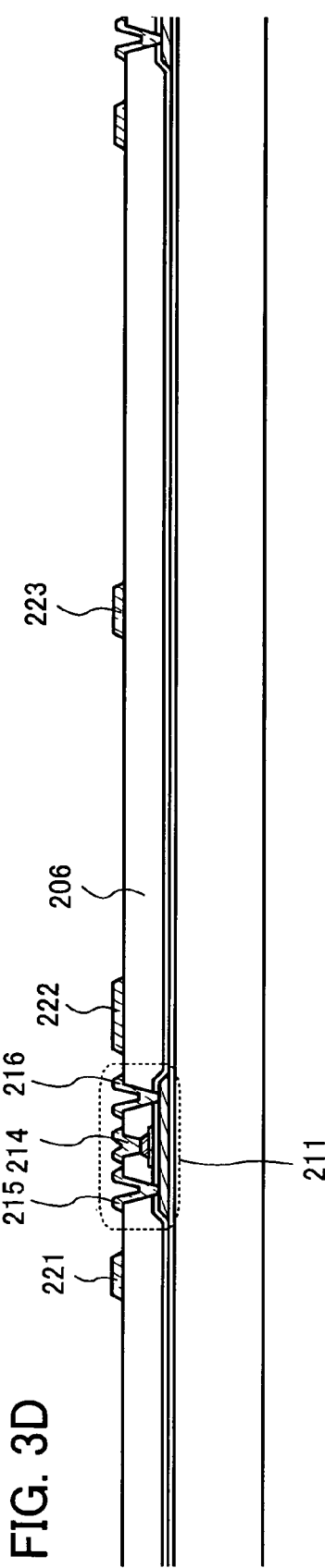

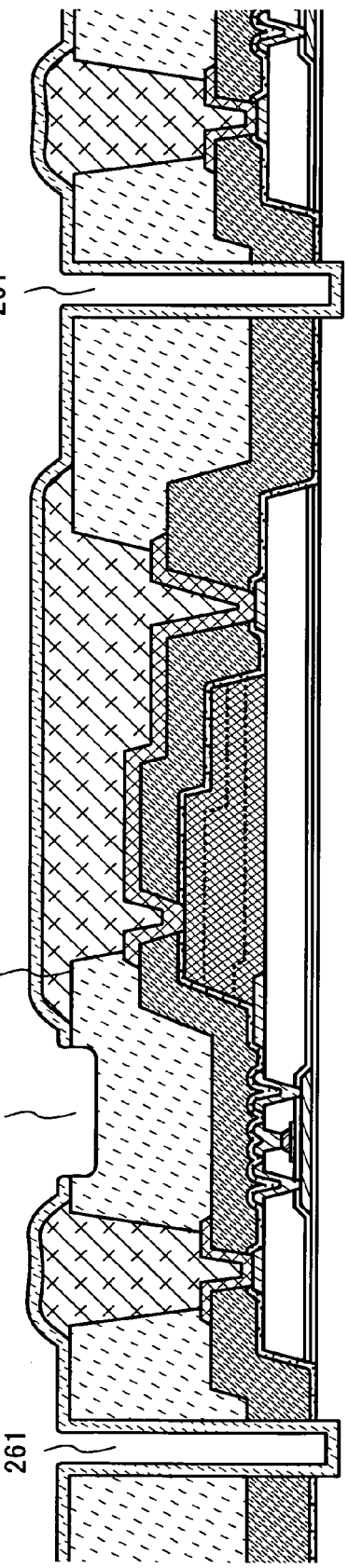
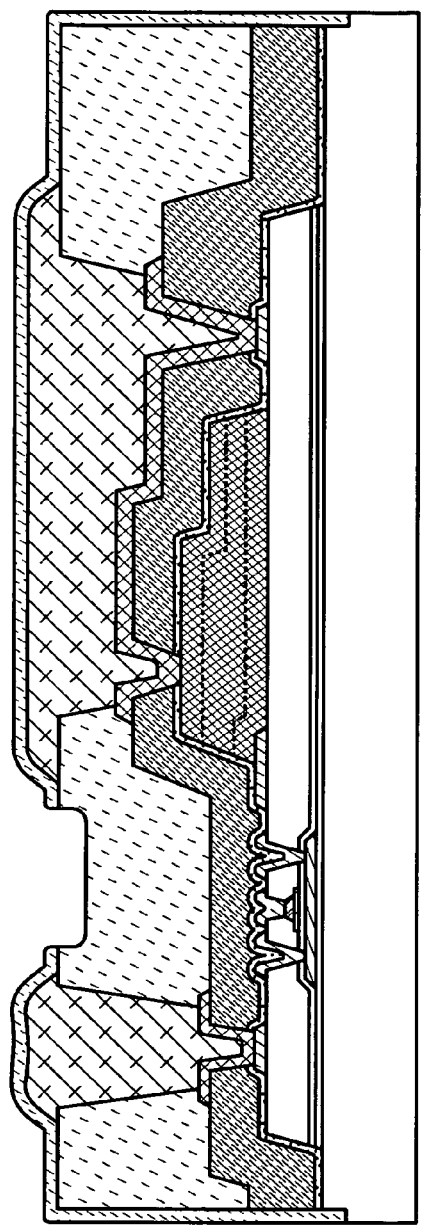
FIG. 7A
FIG. 7B

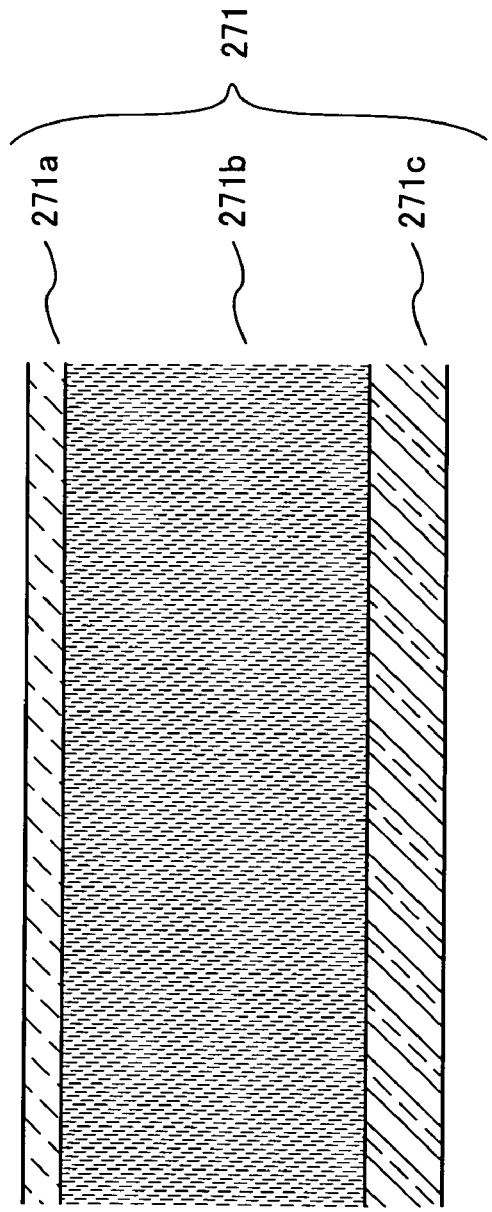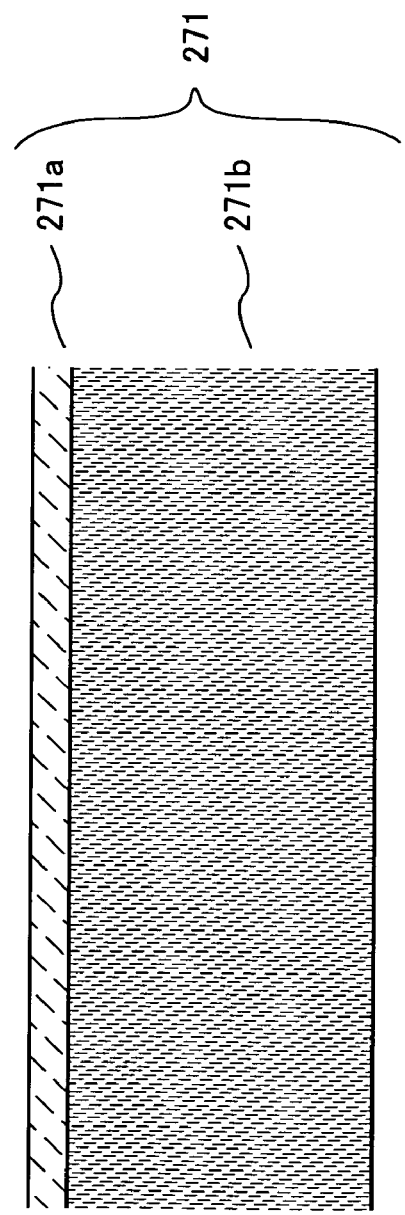
FIG. 9A
FIG. 9B

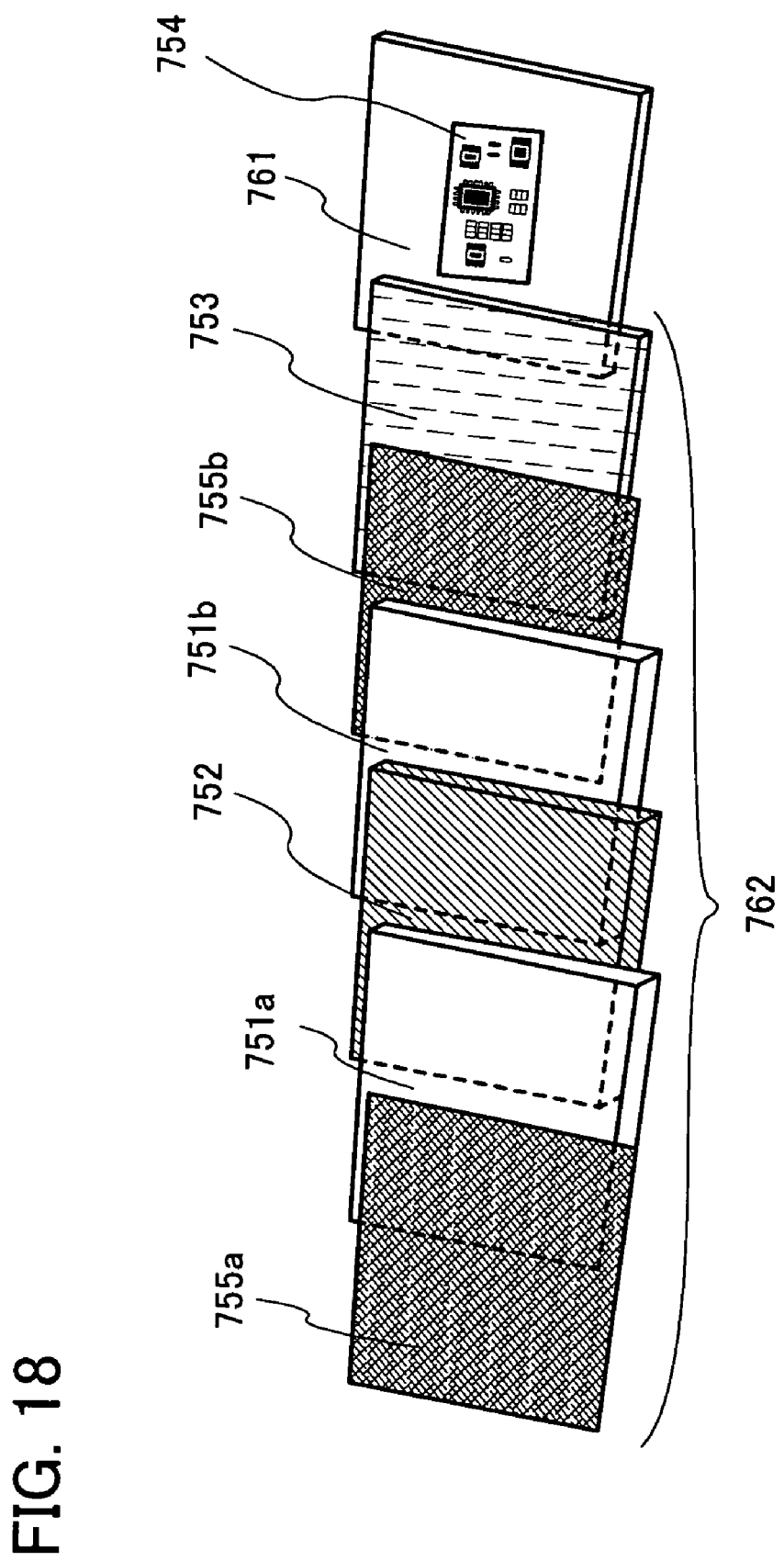

//PHOTOELECTRIC CONVERSION ELEMENT HAVING A SEMICONDUCTOR AND SEMICONDUCTOR DEVICE USING THE SAME

BACKGROUND OF THE INVENTION

1. Field of the Invention

The present invention relates to a photoelectric conversion element formed using a semiconductor and a semiconductor device including the photoelectric conversion element.

2. Description of the Related Art

As one mode of a photoelectric conversion element, a photoelectric conversion element having sensitivity to light with a wavelength of 400 to 700 nm in the visible light region is referred to as a light sensor or a visible light sensor. A known application of a light sensor or a visible light sensor is to detect a light signal and read information and to detect brightness of the ambient environment and control operation of electronic appliances or the like.

For example, a light sensor is used in a cellular phone or a television device so that brightness of a display screen is adjusted according to brightness of the ambient environment where the cellular phone or the television device is placed (see Patent Document 1: Japanese Published Patent Application No. 2002-62856).

FIG. 2A shows a structure of a light sensor disclosed in Patent Document 1. A photoelectric conversion layer 1603 is provided over a substrate 1601 so as to be interposed between a light-reflective electrode 1604b and a light-transmitting electrode 1602 provided with openings 1605 and 1606. The photoelectric conversion layer 1603 has a PIN junction and forms a diode in combination with the light-transmitting electrode 1602 and the light-reflective electrode 1604b. That is, the light sensor has a mode as a two-terminal element. One of external connection terminals is formed of a light-reflective electrode 1604a which is connected to the light-transmitting electrode 1602 through an opening 1607 provided in the photoelectric conversion layer 1603. The other is formed of the light-reflective electrode 1604b. A light-receiving surface is the light-transmitting substrate 1601 side, and light transmitted through the substrate 1601 is incident on the photoelectric conversion layer 1603.

FIG. 2B shows a light sensor in which a light-reflective electrode 1611, a photoelectric conversion layer 1612, and a light-transmitting electrode 1613 are provided in this order over a substrate 1610. This light sensor has a structure in which light is incident on the photoelectric conversion layer 1612 from the light-transmitting electrode 1613 side. Through holes are formed in the light-reflective electrode 1611 and the photoelectric conversion layer 1612, and insulating layers 1614 and 1615 are provided in the through holes. The insulating layers 1614 and 1615 prevents the short-circuit between the light-reflective electrode 1620 and the photoelectric conversion layer 1621, which are located in the neighborhood of an edge of the substrate 1610, and the light-reflective electrode 1611 and the photoelectric conversion layer 1612. The light-transmitting electrode 1613 and the light-transmitting electrode 1619 are electrically insulated from each other by an insulating layer 1616 provided over the photoelectric conversion layer 1612. An external connection terminal 1617 is provided so as to be in contact with the light-transmitting electrode 1619 and is electrically connected to the photoelectric conversion layer 1612 and the light-reflective electrode 1611. The other external connection terminal 1618 is provided so as to be in contact with the light-transmitting electrode 1613.

FIG. 2C shows a mode in which the light sensor shown in FIG. 2A is mounted on a wiring board 1800. The wiring board 1800 and the light sensor are fixed to each other by a photo-curing resin or thermosetting resin 1852 so that the light-reflective electrodes 1604a and 1604b face wirings 1850. The light-reflective electrodes 1604a and 1604b are electrically connected to the wirings 1850 by conductive particles 1851. In addition, FIG. 2D shows a mode in which the light sensor shown in FIG. 2B is mounted on the wiring board 1800. The wiring board 1800 and the light sensor are bonded to each other by a conductive material 1853 such as cream solder or silver paste so that the external connection terminals 1617 and 1618 face the wirings 1850.

SUMMARY OF THE INVENTION

In the mode of the light sensor shown in FIG. 2C, the light sensor is bonded to the wiring board 1800 with only surfaces where the light-reflective electrodes 1604a and 1604b are formed. In addition, in the mode of the light sensor shown in FIG. 2D, the external connection terminals 1617 and 1618 are bonded to the wiring board 1800 only by the conductive material 1853.

If an external terminal of a light sensor and a conductive material are incompatible, the bonding strength is small and separation readily occurs.

It is an object of the present invention to improve the bonding strength between a photoelectric conversion element such as a light sensor and a wiring board or the like and to solve problems such as poor contact and separation when the photoelectric conversion element is mounted on the wiring board or the like.

In the present invention, when an element substrate over which a photoelectric conversion layer is formed is bonded to a wiring board by a conductive material such as solder, a layer containing a material which forms an alloy with the conductive material is formed as an uppermost layer of the element substrate. Accordingly, the bonding strength between the element substrate and the wiring board is increased and separation between the element substrate and the wiring board can be suppressed.

The present invention relates to a semiconductor device below.

Specifically, the present invention relates to a semiconductor device which has a feature that a photoelectric conversion layer; an amplifier circuit including at least two thin film transistors, which amplifies output current of the photoelectric conversion layer; a first electrode which supplies high-potential power supply voltage and a second electrode which supplies low-potential power supply voltage, which are electrically connected to the photoelectric conversion layer and the amplifier circuit; and a bonding layer which forms an alloy with a conductive material as an uppermost layer of a first substrate are formed over the first substrate, and the conductive material which bonds a third electrode to a fourth electrode, the first electrode to the third electrode, and the second electrode to the fourth electrode is provided over a second substrate.

In the present invention, the bonding layer contains one of nickel (Ni), copper (Cu), zinc (Zn), palladium (Pd), silver (Ag), tin (Sn), platinum (Pt), and gold (Au), and the conductive material is solder.

In the present invention, the first electrode and the second electrode are formed with use of nickel paste.

In the present invention, a fifth electrode and a sixth electrode are formed over the first electrode and the second electrode, respectively, and the fifth electrode and the sixth electrode are formed with use of copper paste.

In the present invention, the amplifier circuit is a current mirror circuit.

Note that, in this specification, a semiconductor device means elements and devices in general, which operate by utilization of a semiconductor, and a photoelectric conversion element utilizing a semiconductor, a photoelectric conversion device including a photoelectric conversion element, and an electronic appliance with an element which functions by utilization of a semiconductor are included in the category.

According to the present invention, the bonding strength between a substrate and a photoelectric conversion element can be increased and separation between the substrate and the photoelectric conversion element can be prevented. Accordingly, reliability of the photoelectric conversion element is improved.

BRIEF DESCRIPTION OF THE DRAWINGS

In the accompanying drawings:

FIGS. 3A to 3D are cross-sectional views showing a manufacturing process of a photoelectric conversion element of the present invention;

FIGS. 7A and 7B are cross-sectional views showing a manufacturing process of a photoelectric conversion element of the present invention;

FIGS. 9A and 9B are cross-sectional views showing a manufacturing process of a photoelectric conversion element of the present invention;

FIG. 18 is a diagram showing a device mounted with a semiconductor device of the present invention;

DETAILED DESCRIPTION OF THE INVENTION

Figure 1:
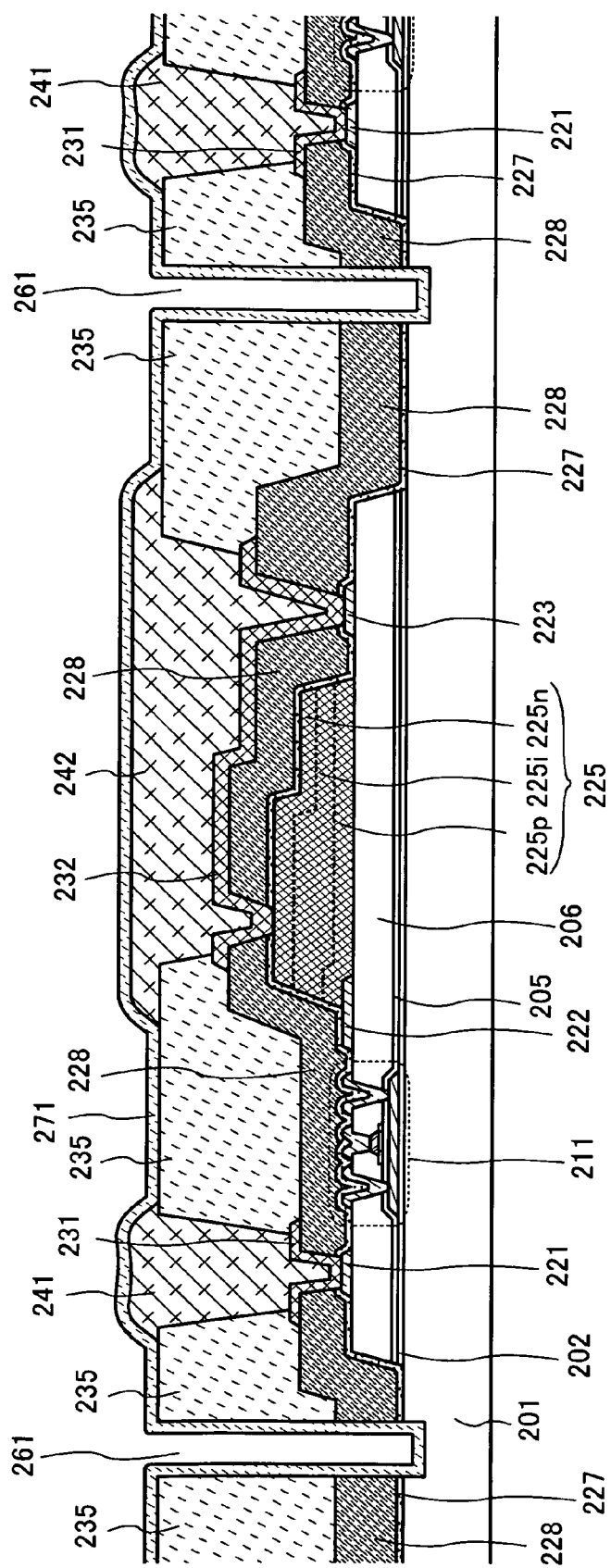
FIG. 1 is a cross-sectional view showing a manufacturing process of a photoelectric conversion element of the present invention.
Figure 2A:
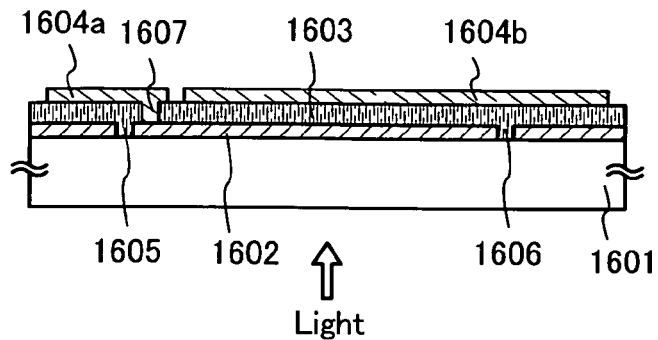
FIGS. 2A to 2D are cross-sectional views each showing a manufacturing process of a conventional photoelectric conversion element.
Figure 2B:
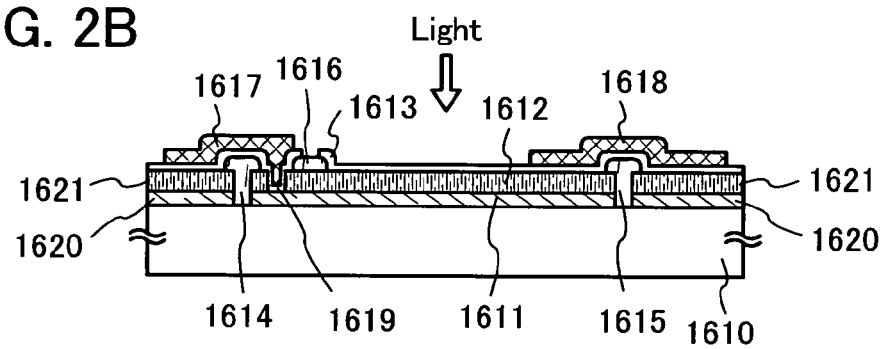
Figure 2C:
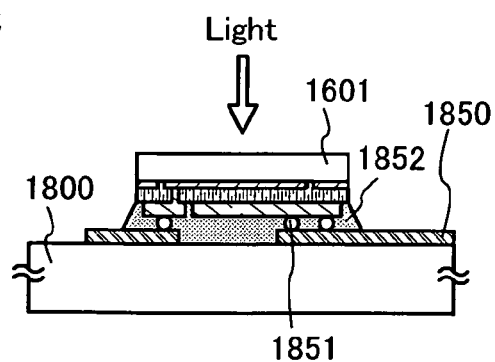
Figure 2D:
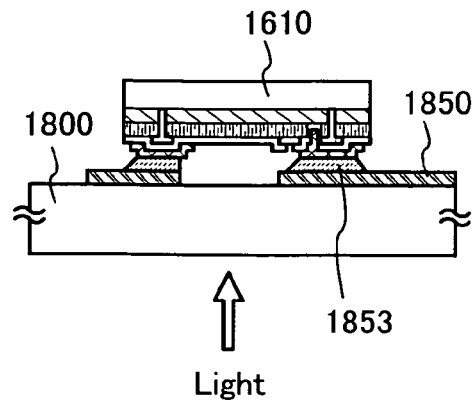

Embodiment Modes of the present invention will be hereinafter described with reference to the accompanying drawings. However, the present invention can be carried out in many different modes and it is easily understood by those skilled in the art that modes and details of the present invention can be modified in various ways without departing from the purpose and scope of the present invention. Therefore, the present invention should not be interpreted as being limited to the following description of Embodiment Modes. Note that in all drawings for describing Embodiment Modes, the same portions or portions having similar functions are denoted by the same reference numerals, and repeated explanation thereof will be omitted.

Embodiment Mode 1

This embodiment mode will be described with reference to FIG. 1, FIGS. 3A to 3D, FIGS. 4A to 4C, FIGS. 5A to 5C, FIGS. 6A and 6B, FIGS. 7A and 7B, FIG. 8, FIGS. 9A and 9B, FIG. 10, FIG. 11, FIG. 12, FIG. 13, FIG. 14, FIG. 21, FIGS. 22A and 22B, and FIG. 23.

A manufacturing method of a photoelectric conversion element of this embodiment mode is described below.

First, an insulating film 202 is formed over a substrate 201 (see FIG. 3A). As the substrate 201, a light-transmitting substrate, for example, any of a glass substrate, a quartz substrate, a ceramic substrate, or the like can be used. In this embodiment mode, a glass substrate is used as the substrate 201.

As the insulating film 202, a film may be formed of silicon oxide, silicon oxide containing nitrogen, silicon nitride, silicon nitride containing oxygen, or a metal oxide material by a sputtering method or a plasma CVD method.

Alternatively, the insulating film 202 may be formed as a two-layer structure of a lower insulating film and an upper insulating film. As the lower insulating film, for example, a silicon nitride film containing oxygen ($SiO_xN_y$: y>x) is preferably used. As the upper insulating film, for example, a silicon oxide film containing nitrogen ($SiO_xN_y$: x>y) is preferably used. The insulating film 202 is formed as the two-layer structure, whereby impurities such as moisture entering the element from the substrate 201 side can be prevented.

Next, a crystalline semiconductor film is formed over the insulating film 202 and the crystalline semiconductor film is etched into an island shape, whereby an island-shaped semiconductor film 212 for serving as an active layer is formed.

In addition, a gate insulating film 205 is formed to cover the island-shaped semiconductor film 212 (see FIG. 3B). Next, a lower gate electrode 213a and an upper gate electrode 213b are provided over the gate insulating film 205 (see FIG. 3C). Although, in FIG. 3C, a gate electrode 213 has a two-layer structure of the lower gate electrode 213a and the upper gate electrode 213b, the gate electrode 213 may be formed as a single-layer structure. In addition, a source region, a drain region, and a channel formation region are formed in the island-shaped semiconductor film 212.

An interlayer insulating film 206 is formed to cover the gate insulating film 205 and the gate electrode 213 including the lower gate electrode 213a and the upper gate electrode 213b.

Note that the interlayer insulating film 206 may be formed of a single insulating film or stacked insulating layers formed of different materials.

A source electrode 215 and a drain electrode 216 are formed over the interlayer insulating film 206, which is to be electrically connected, respectively, to the source region and the drain region in the island-shaped semiconductor film 212. Moreover, a gate wiring 214 is formed to be electrically connected to the gate electrode 213.

Furthermore, electrodes 221, 222, and 223, which are formed of the same material and in the same process as the gate wiring 214, the source electrode 215, and the drain electrode 216, are formed over the interlayer insulating film 206 (see FIG. 3D). These electrodes 221 to 223 may be formed of a material and in a process that are different from those of the gate wiring 214, the source electrode 215, and the drain electrode 216.

The gate wiring 214, the source electrode 215, the drain electrode 216, and the electrodes 221 to 223 are formed using a metal film, for example, a low-resistant metal film. As such a low-resistant metal film, an aluminum alloy, pure aluminum, and the like can be represented. In this embodiment mode, a three-layer structure in which a titanium film (Ti film), an aluminum film (Al film), and a titanium film (Ti film) are sequentially stacked is employed as a stacked-layer structure of a refractory metal film and a low-resistant metal film.

Instead of the stacked-layer structure of the refractory metal film and the low-resistant metal film, each of the gate wiring 214, the source electrode 215, the drain electrode 216, and the electrodes 221 to 223 can be formed of a single-layer conductive film. As such a single-layer conductive film, the following can be used: a single-layer film formed of an element selected from titanium (Ti), tungsten (W), tantalum (Ta), molybdenum (Mo), neodymium (Nd), cobalt (Co), zirconium (Zr), zinc (Zn), ruthenium (Ru), rhodium (Rh), palladium (Pd), osmium (Os), iridium (Ir), or platinum (Pt), or an alloy or compound containing the aforementioned element as its main component; or a single-layer film formed of nitride of the element, for example, titanium nitride, tungsten nitride, tantalum nitride, or molybdenum nitride.

Note that, in this embodiment mode, each of the gate wiring 214, the source electrode 215, the drain electrode 216, and the electrodes 221 to 223 is formed using a titanium (Ti) film formed to a thickness of 400 nm.

Although a TFT 211 is a top gate TFT in this embodiment mode, the TFT 211 may be a bottom gate TFT. Alternatively, the TFT 211 may be a single gate TFT which includes one channel formation region, or a multigate TFT which includes a plurality of channel formation regions.

Note that only one TFT is shown in FIG. 3D. In practice, however, at least two TFTs are formed as the TFT 211, which constitutes a part of an amplifier circuit configured to amplify photoelectric current obtained by a photo diode 101 which is to be described later, for example, a current mirror circuit.

Figure 4A:
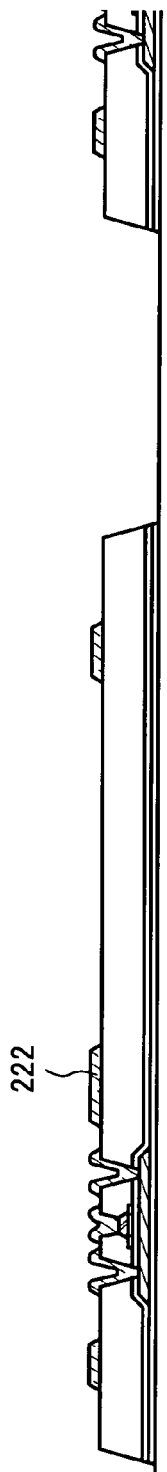
FIGS. 4A to 4C are cross-sectional views showing a manufacturing process of a photoelectric conversion element of the present invention.

Next, etching is performed so that edge portions of the interlayer insulating film 206, the gate insulating film 205, and the insulating film 202 have a tapered shape (see FIG. 4A).

The edge portions of the interlayer insulating film 206, the gate insulating film 205, and the insulating film 202 have the tapered shape, whereby coverage by a protective film 227 which is to be formed over these films is improved, giving an effect to reduce the probability that moisture, impurities, or the like enters these films.

Figure 4B:
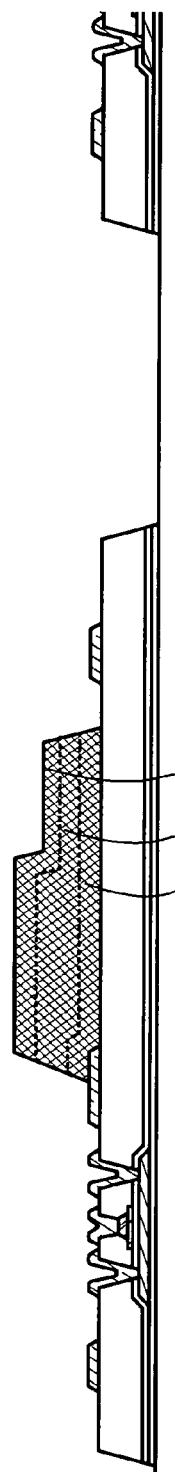

Next, a p-type semiconductor film, an i-type semiconductor film, and an n-type semiconductor film are formed over the interlayer insulating film 206 and the electrode 222, and these films are etched, whereby a photoelectric conversion layer 225 including a p-type semiconductor layer 225p, an i-type semiconductor layer 225i, and an n-type semiconductor layer 225n is formed (see FIG. 4B).

The p-type semiconductor layer 225p may be formed of an amorphous semiconductor film containing an impurity element of Group 13, for example, boron (B) by a plasma CVD method.

In FIG. 4B, the lowest layer of the photoelectric conversion layer 225, which is the p-type semiconductor layer 225p in this embodiment mode, is in contact with the electrode 222.

As the i-type semiconductor layer 225i, an amorphous semiconductor film may be formed by a plasma CVD method, for example. As the n-type semiconductor layer 225n, an amorphous semiconductor film containing an impurity element of Group 15, for example, phosphorus (P) may be formed, or the impurity element of Group 15 may be introduced after the amorphous semiconductor film is formed.

Note that an amorphous silicon film, an amorphous germanium film, or the like may be used as the amorphous semiconductor film.

Note that, in this specification, the i-type semiconductor film means a semiconductor film in which impurities imparting p-type or n-type conductivity are contained at a concentration of $1 \times 10^{20}$ cm$^{-3}$ or less, each of oxygen and nitrogen is contained at a concentration of $5 \times 10^{19}$ cm$^{-3}$ or less, and which has photoconductivity of 100 or more times as high as dark conductivity. In addition, boron (B) may be added to the i-type semiconductor film at 10 to 1000 ppm.

Alternatively, not only an amorphous semiconductor film but also a microcrystalline semiconductor film (also referred to as a semi-amorphous semiconductor film) may be used as each of the p-type semiconductor layer 225p, the i-type semiconductor layer 225i, and the n-type semiconductor layer 225n.

Further alternatively, a microcrystalline semiconductor film may be used as each of the p-type semiconductor layer 225p and the n-type semiconductor layer 225n, and an amorphous semiconductor film may be used as the i-type semiconductor layer 225i.

Note that a semi-amorphous semiconductor (in this specification, also referred to as "SAS") film is a film containing a semiconductor having an intermediate structure between an amorphous semiconductor and a crystalline (including single crystal and polycrystalline) semiconductor. The semi-amorphous semiconductor film is a semiconductor film having a third state which is stable in terms of free energy, and is a crystalline substance having short-range order and lattice distortion. The crystal grain with a size of 0.5 to 20 nm can exist in a dispersed state in a non-single crystalline semiconductor film. Note that a microcrystalline semiconductor film (microcrystal semiconductor film) is also included in the category of the semi-amorphous semiconductor film.

A semi-amorphous silicon film is given as an example of the semi-amorphous semiconductor film. The Raman spectrum of the semi-amorphous silicon film is shifted to a wavenumber side lower than 520 cm$^{-1}$, and the diffraction peaks of (111) and (220) that are thought to be derived from a Si crystal lattice are observed in X-ray diffraction. In addition, hydrogen or halogen of at least 1 at % or more to terminate dangling bonds is added to the semi-amorphous silicon film. In this specification, such a silicon film is referred to as a semi-amorphous silicon film for the sake of convenience. Moreover, a rare gas element such as helium, argon, krypton, or neon may be added to the silicon film to further promote lattice distortion, whereby stability is enhanced and a semi-amorphous semiconductor film with favorable characteristics can be obtained.

The semi-amorphous silicon film can be obtained by glow discharge decomposition of a gas containing silicon. SiH$_4$ is a typical gas containing silicon, and Si$_2$H$_6$, SiH$_2$Cl$_2$, SiHCl$_3$, SiCl$_4$, SiF$_4$, or the like can be used as well as SiH$_4$. The semi-amorphous silicon film can be easily formed with use of the gas containing silicon diluted with hydrogen or a gas in which one or more of rare gas elements selected from helium, argon, krypton, and neon is/are added to hydrogen. It is desirable that the gas containing silicon be diluted at a dilution ratio in the range of 2 to 1000 times. Alternatively, a gas of a carbon-containing compound, such as CH$_4$ or C$_2$H$_6$, a gas including germanium, such as GeH$_4$ or GeF$_4$, F$_2$, or the like may be mixed into the gas containing silicon so that the energy bandwidth is adjusted to be 1.5 to 2.4 eV or 0.9 to 1.1 eV.

Note that, in this specification, the photoelectric conversion layer 225, a photo diode including the photoelectric conversion layer 225, and an element including the photodiode are referred to as a photoelectric conversion element.

Figure 4C:
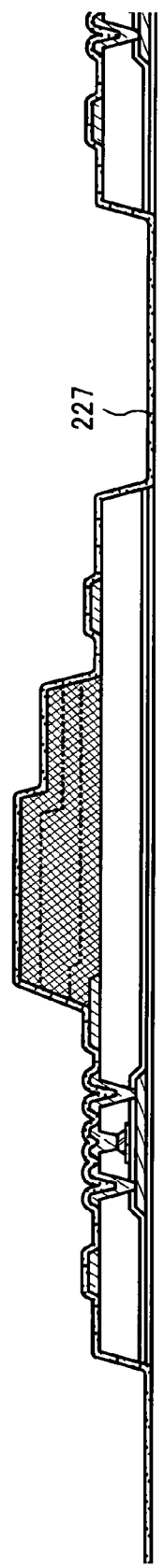

Next, the protective film 227 is formed so as to cover an exposed surface (see FIG. 4C). In this embodiment mode, a silicon nitride film is used as the protective film 227. The protective film 227 can prevent moisture or impurities such as an organic substance from entering the TFT 211 and the photoelectric conversion layer 225.

Figure 5A:
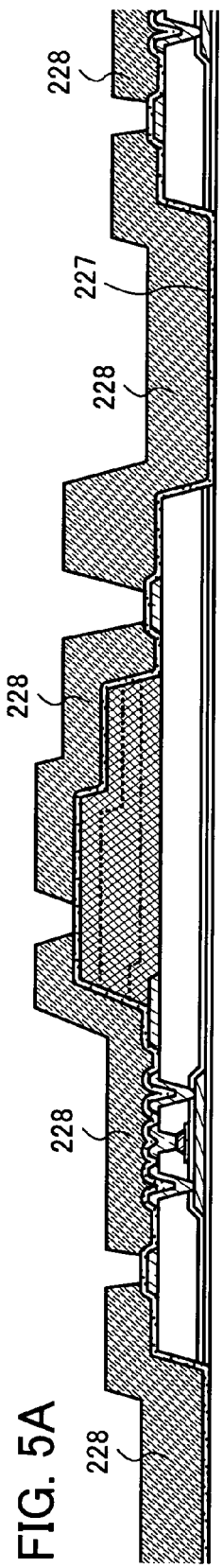
FIGS. 5A to 5C are cross-sectional views showing a manufacturing process of a photoelectric conversion element of the present invention.
Figure 5B:
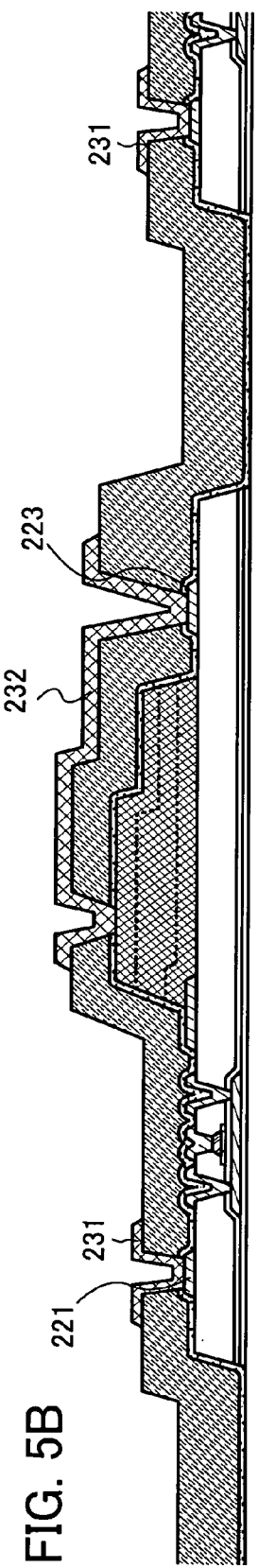

Next, an interlayer insulating film 228 is formed over the protective film 227 (see FIG. 5A). The interlayer insulating film 228 also functions as a planarizing film. In this embodiment mode, polyimide is formed to have a thickness of 2 µm as the interlayer insulating film 228.

Next, the interlayer insulating film 228 is etched, whereby contact holes are formed. At the time of the etching, the gate wiring 214, the source electrode 215, and the drain electrode 216 of the TFT 211 are not etched due to the presence of the protective film 227. Next, the protective film 227 in regions where an electrode 231 and an electrode 232 are to be formed is etched, whereby contact holes are formed. In addition, over the interlayer insulating film 228, the electrode 231 is formed to be electrically connected to the electrode 221 through the contact hole formed in the interlayer insulating film 228 and the protective film 227, and the electrode 232 is formed to be electrically connected to the electrode 223 and the upper layer (in this embodiment mode, the n-type semiconductor layer 225n) of the photoelectric conversion layer 225 through the contact hole formed in the interlayer insulating film 228 and the protective film 227 (see FIG. 5B). Tungsten (W), titanium (Ti), tantalum (Ta), silver (Ag), or the like can be used for the electrodes 231 and 232.

In this embodiment mode, a conductive film formed of titanium (Ti) formed to a thickness of 30 to 50 nm is used as the electrodes 231 and 232.

Figure 5C:
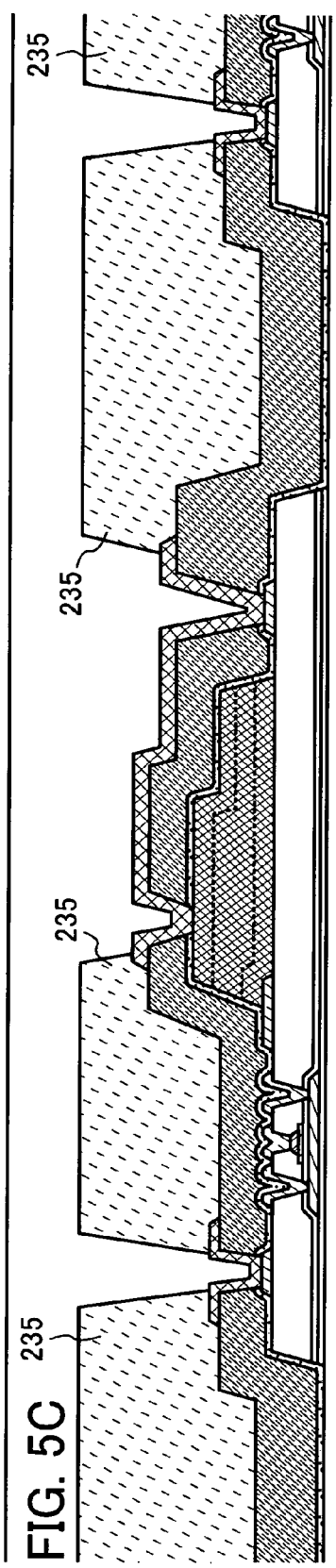

Next, an interlayer insulating film 235 is formed over the interlayer insulating film 228 by a screen printing method or an ink jet method (see FIG. 5C). In the formation of the interlayer insulating film 228, the interlayer insulating film 235 is not formed over the electrodes 231 and 232. In this embodiment mode, an epoxy resin is used for the interlayer insulating film 235.

Figure 6A:
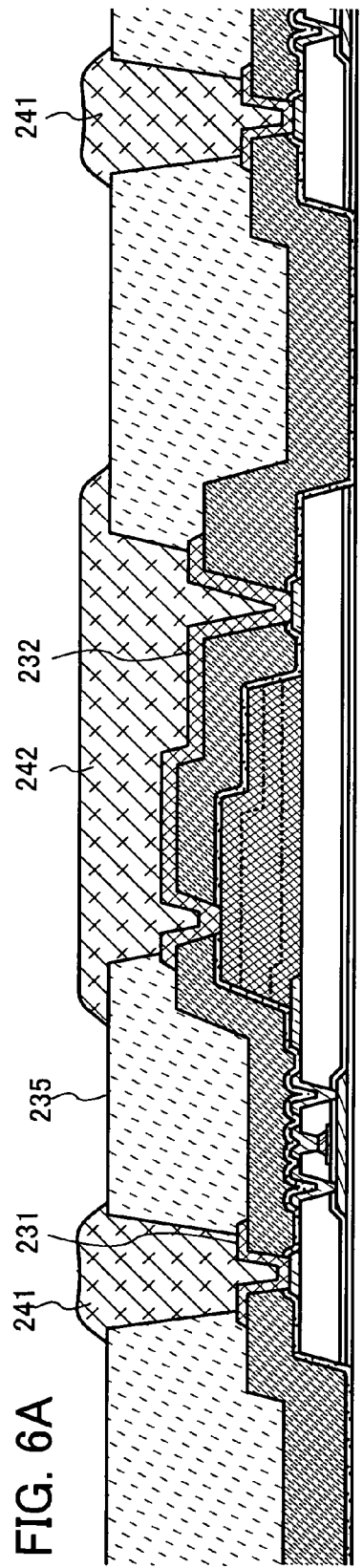
FIGS. 6A and 6B are cross-sectional views showing a manufacturing process of a photoelectric conversion element of the present invention.

Next, over the interlayer insulating film 235, an electrode 241 is formed to be electrically connected to the electrode 231, and an electrode 242 is formed to be electrically connected to the electrode 232 with use of nickel (Ni) past by a printing method, for example (see FIG. 6A).

Figure 6B:
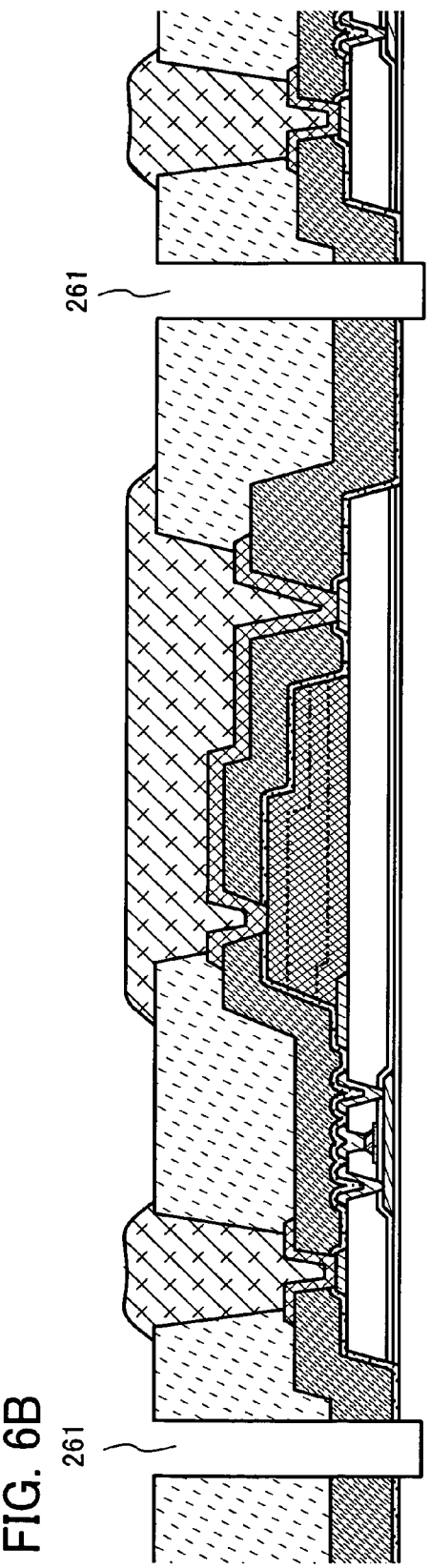

Next, in order to electrically separate adjacent elements from each other, parts of the substrate 201, the protective film 227, the interlayer insulating film 228, and the interlayer insulating film 235 are removed in a dicing process, whereby slits 261 are formed (see FIG. 6B).

Alternatively, parts of the interlayer insulating films 228 and 235 and the substrate 201 may be removed by laser irradiation instead of the dicing process.

A laser includes a laser medium, an excitation source, and an oscillator. As for the laser, a gas laser, a liquid laser, and a solid-state laser are provided when classified according to the medium, and a free electron laser, a semiconductor laser, and an X-ray laser are represented when classified according to the oscillation characteristics. However, any of the lasers may be used for element separation. Note that, it is preferable to use a gas laser or a solid-state laser, and it is more preferable to use a solid-state laser.

As a gas laser, a helium-neon laser, a carbon dioxide gas laser, an excimer laser, an argon ion laser, and the like are exemplified. As an excimer laser, a rare gas excimer laser and a rare gas halide excimer laser are given. As the medium of the rare gas excimer laser, argon, krypton, and xenon are represented. As a gas laser, a metal vapor ion laser is provided.

As a liquid laser, an inorganic liquid laser, an organic chelate laser, and a dye laser are exemplified. An inorganic liquid laser and an organic chelate laser use, as a laser medium, a rare-earth ion such as neodymium utilized in a solid-state laser.

A laser medium used in a solid-state laser is a solid base doped with active species which are capable of lasing. The solid base refers to a crystal or glass. The crystal refers to YAG (yttrium aluminum garnet crystal), YLF, YVO$_4$, YAlO$_3$, sapphire, ruby, or alexandrite. The active species which are capable of lasing refer to, for example, trivalent ions (such as Cr$^{3+}$, Nd$^{3+}$, Yb$^{3+}$, Tm$^{3+}$, Ho$^{3+}$, Er$^{3+}$, and Ti$^{3+}$).

Note that a continuous-wave laser or a pulsed laser can be used as a laser for the separation of the adjacent elements. The conditions of laser beam irradiation are controlled as appropriate in consideration of the thicknesses, materials, and the like of the substrate 201, the protective film 227, and the interlayer insulating films 228 and 235.

In the case where the substrate 201 is a glass substrate, a solid-state laser beam with a wavelength of greater than or equal to 1 nm and less than or equal to 380 nm in the ultraviolet region is preferably used as a laser beam. This is because an ablation process can be easily performed, which results from the fact that laser light with a wavelength in the ultraviolet region is more easily absorbed by a substrate (especially a glass substrate) than another laser beam with a longer wavelength. More preferably, an Nd:YVO$_4$ laser beam with a wavelength of greater than or equal to 1 nm and less than or equal to 380 nm in the ultraviolet region is used. This is because an ablation process is easily performed especially when an Nd:YVO$_4$ laser beam is used.

When a laser beam is emitted to a glass substrate to form a groove in the glass substrate, a cut surface of the groove is rounded. If the cut surface is rounded, a chip of a corner of the cut surface, or crack can be prevented from being generated, in comparison with a case where the cut surface has a corner. Such an advantage facilitates the handling of a glass substrate mainly when the glass substrate is carried by a robot or the like. In addition, when the photoelectric conversion element formed on a glass substrate is mounted on a product, generation of a chip or a crack can be suppressed, and accordingly generation of damage or destruction of the substrate can be suppressed.

In the ablation process, a phenomenon is used in which a molecule which absorbs a laser beam undergoes bond-cleavage and then photolysis to result in decomposition products which are evaporated. In other words, in a formation method of the groove of this embodiment mode, a molecular bond of a molecule irradiated with the laser beam is cleaved, the molecule is photolyzed to give decomposition products, and the decomposition products are evaporated, whereby the groove is formed in the substrate.

Note that a laser irradiation apparatus for emitting the above-described laser beam includes a moving table, a substrate, a head portion, and a control portion. The moving table is provided with an adsorption hole. The substrate is held by the adsorption hole over the moving table. The head portion applies a laser beam which is emitted from a laser oscillation apparatus, through a laser head. The control portion moves one or both of the moving table and the head portion, which allows the laser head to be positioned at an arbitrary place over a surface of the substrate and to apply a laser beam thereat. Note that the control portion recognizes and determines a portion to be processed from a relative position on the basis of a mark for positioning over a substrate which is taken by a CCD camera.

Next, a bonding layer 271 is formed so as to cover the interlayer insulating film 235, the electrodes 241 and 242, and the slits 261 (see FIG. 1).

The bonding layer 271 contains a metal which forms an alloy with solder, for example, at least one of nickel (Ni), copper (Cu), zinc (Zn), palladium (Pd), silver (Ag), tin (Sn), platinum (Pt), or gold (Au). In particular, at least one of nickel (Ni), copper (Cu), silver (Ag), platinum (Pt), or gold (Au) is preferably used.

In this embodiment mode, the bonding layer 271 is formed by a sputtering method in such a manner that a gold (Au) layer with a thickness of 50 nm as a first layer 271a, a nickel (Ni) layer with a thickness of 300 to 500 nm as a second layer 271b, and a titanium (Ti) layer with a thickness of 100 nm as a third layer 271c are stacked (see FIG. 9A).

The titanium (Ti) layer has a good contact with nickel paste which is a material of the electrodes 241 and 242. The nickel (Ni) layer contains nickel which is a material of the electrodes 241 and 242 and a material which easily forms an alloy with solder. In addition, gold (Au) easily forms an alloy with solder and has a function of protecting a surface of the nickel layer. Note that the third layer 271c is not required to be formed if not necessary (see FIG. 9B).

Among the stacked layers which form the bonding layer 271, the nickel layer which is the second layer 271b mainly forms an alloy with solder, and bonds the electrodes 241 and 242 to electrodes 283 and 282, respectively, which are to be formed later.

Although the nickel layer is used as the second layer 271b in this embodiment mode, instead of the nickel layer, the above-described metal such as copper (Cu), zinc (Zn), palladium (Pd), silver (Ag), tin (Sn), platinum (Pt), or gold (Au) may be subjected to the film formation using a sputtering method.

Alternatively, instead of the gold layer, a layer which is formed by a sputtering method using tin (Sn) or solder as a target may be used as the first layer 271a.

Figure 20:
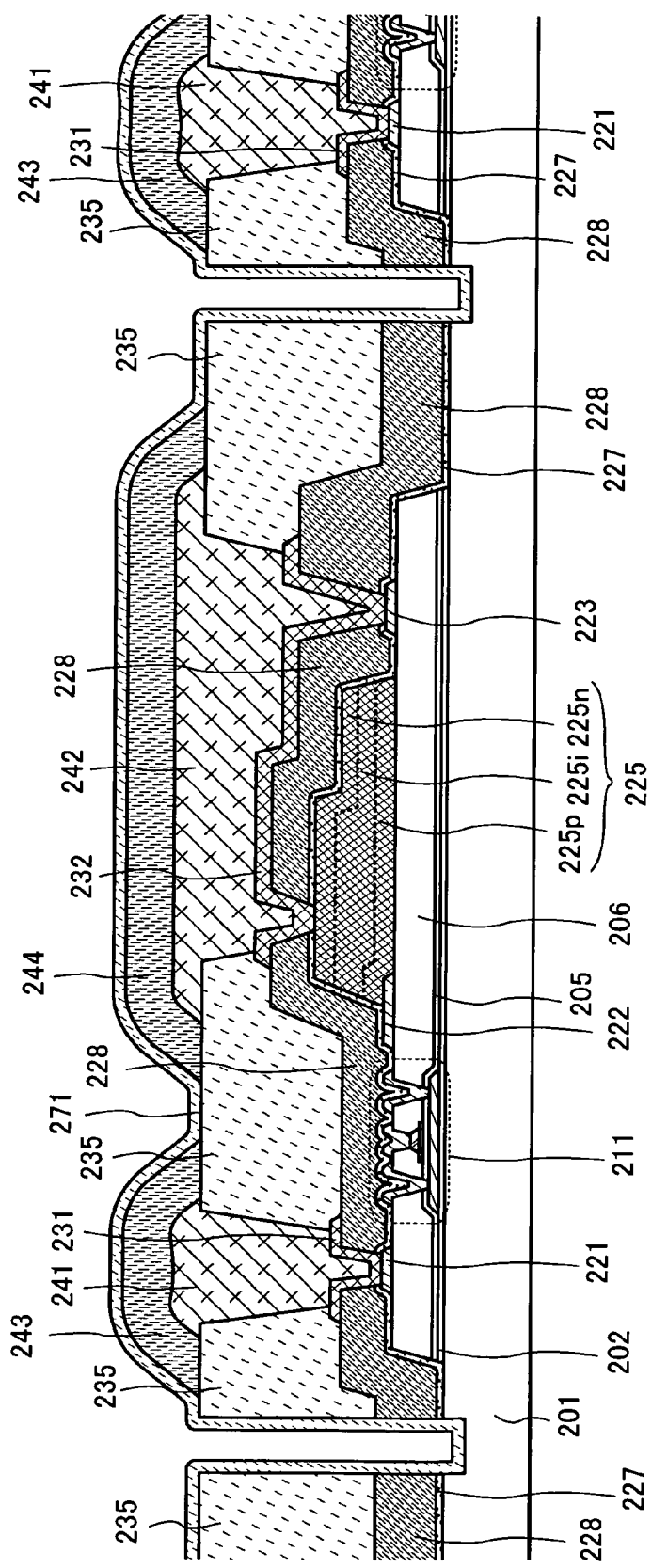
FIG. 20 is a cross-sectional view showing a manufacturing process of a photoelectric conversion element of the present invention.

Note that, for example, an electrode 243 and an electrode 244 may be formed of copper (Cu) paste over the electrode 241 and the electrode 242, respectively (see, FIG. 20). In this case, the bonding layer 271 is formed over the electrode 243 and the electrode 244. The bonding layer 271 in this case also preferably contains at least one of nickel (Ni), copper (Cu), zinc (Zn), palladium (Pd), silver (Ag), tin (Sn), platinum (Pt), or gold (Au). It is more preferable that the bonding layer 271 contain copper (Cu) because copper forms an alloy with solder easily and is bonded to the copper paste more easily.

Next, an opening 265 for electrical insulation between the electrode 241 and the electrode 242 is formed in the interlayer insulating film 235 by dicing or laser beam irradiation (see FIG. 7A). The electrodes 241 and 242 can be short-circuited due to the bonding layer 271 unless the opening 265 is formed. The above-described laser may be used for the laser beam.

Next, the slits 261 is further subjected to dicing, and thus individual elements are separated, whereby one photoelectric conversion element is formed (see FIG. 7B).

This separation process may also be performed by laser irradiation, instead of dicing.

Figure 8:
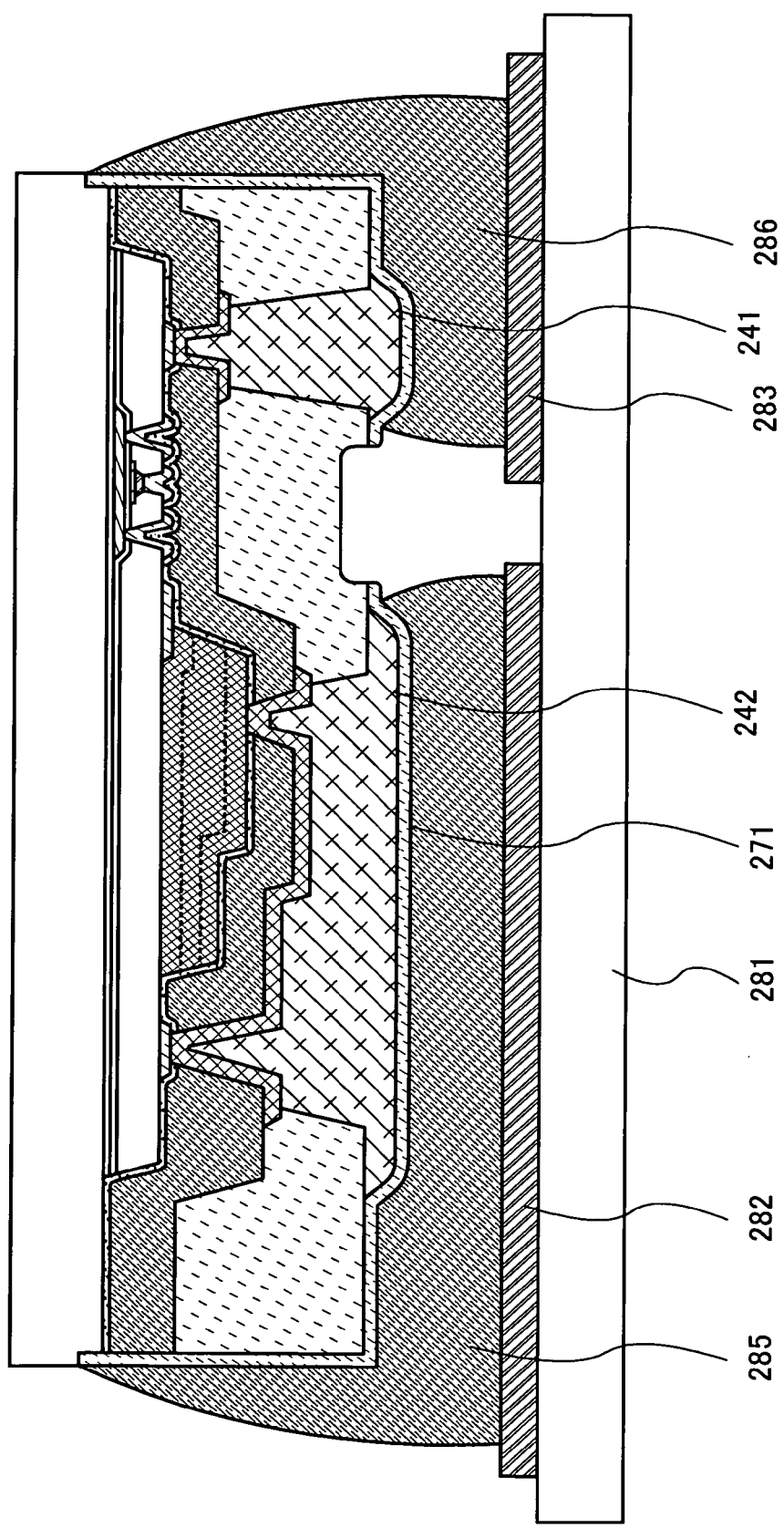
FIG. 8 is a cross-sectional view showing a manufacturing process of a photoelectric conversion element of the present invention.

The element is bonded to a printed circuit board 281 over which the electrodes 282 and 283 are formed (see FIG. 8). The element and the printed circuit board 281 are bonded to each other with use of solder as conductive materials 285 and 286 so that the electrode 241 and the electrode 283 face each other and the electrode 242 and the electrode 282 face each other. Since the bonding layer 271 is formed, the bonding strength of the electrodes 241 and 242 and the conductive materials 285 and 286 using the solder is increased. Thus, separation between the printed circuit board 281 and the photoelectric conversion element can be suppressed.

In the case where solder is used as the conductive materials 285 and 286, a reflow method, that is, a method in which solder in paste form is printed on the printed circuit board, parts are mounted thereon, and then the solder is melted by application of heat. As a heating method, an infrared ray method, a hot air method, and the like can be employed.

Figure 21:
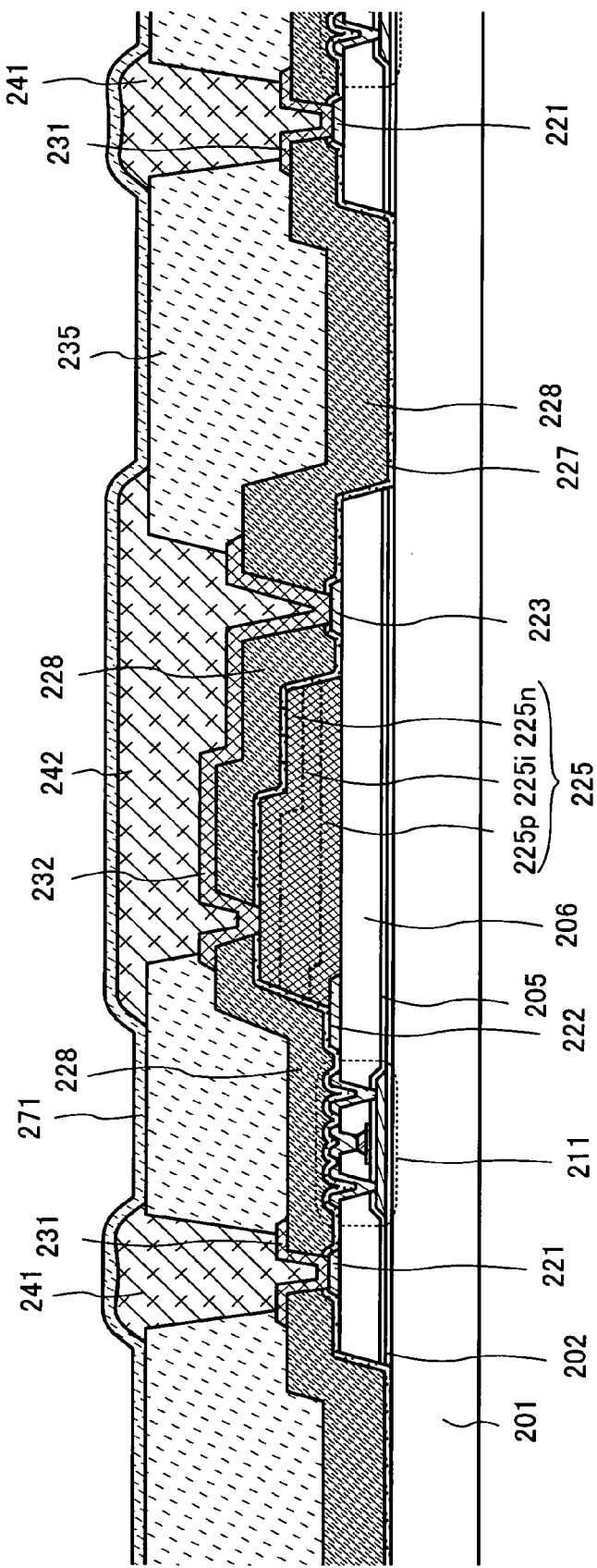
FIG. 21 is a cross-sectional view showing a manufacturing process of a photoelectric conversion element of the present invention.
Figure 22A:
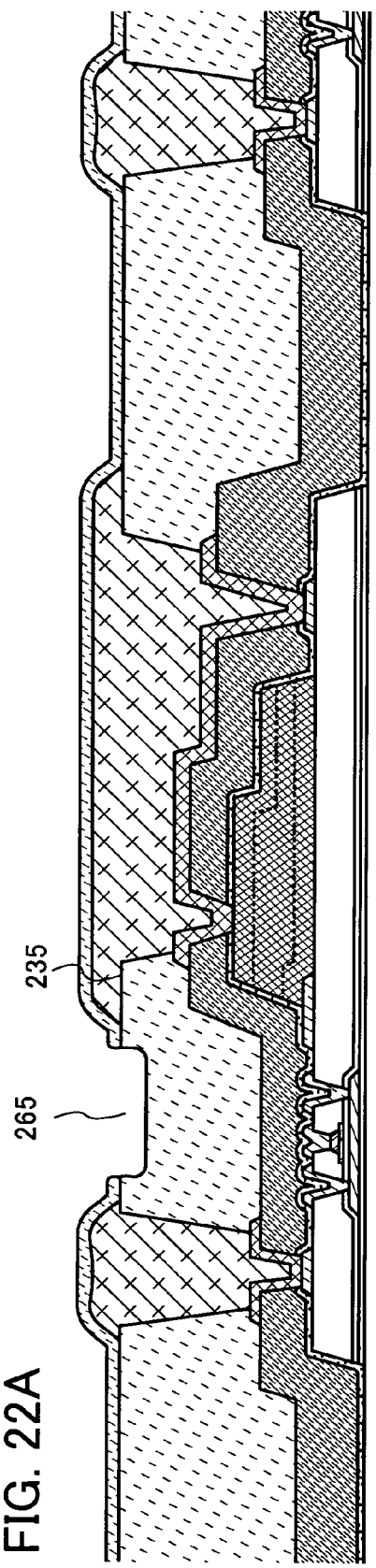
FIGS. 22A and 22B are cross-sectional views showing a manufacturing process of a photoelectric conversion element of the present invention.
Figure 22B:
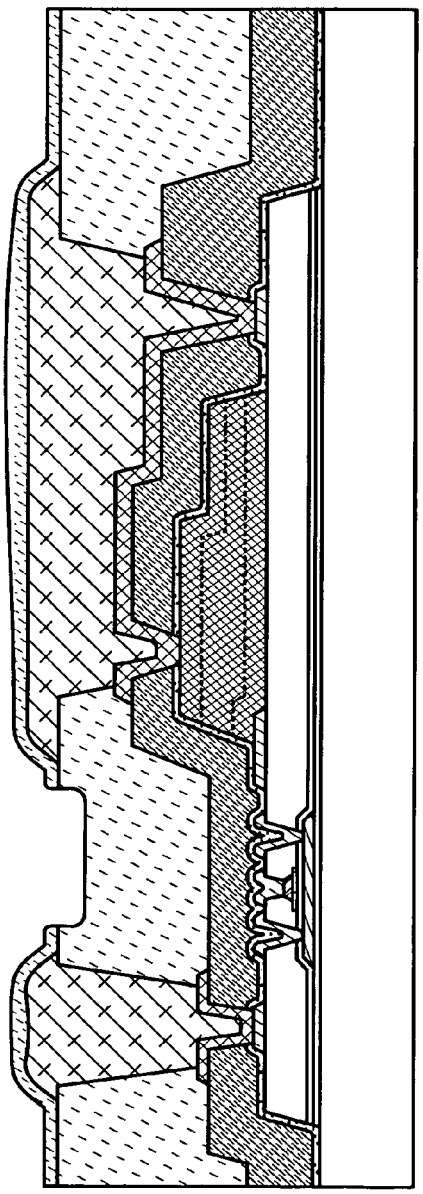

Alternatively, after forming the structure shown in FIG. 6A, the bonding layer 271 may be formed over the electrodes 241 and 242, and the interlayer insulating film 235 without forming the slit 261 (see FIG. 21). After that, the opening 265 for electrical insulation is formed in the interlayer insulating film 235 by dicing or laser beam irradiation (see FIG. 22A). Individual elements are separated by dicing or laser irradiation, whereby one photoelectric conversion element is formed (see FIG. 22B).

Figure 23:
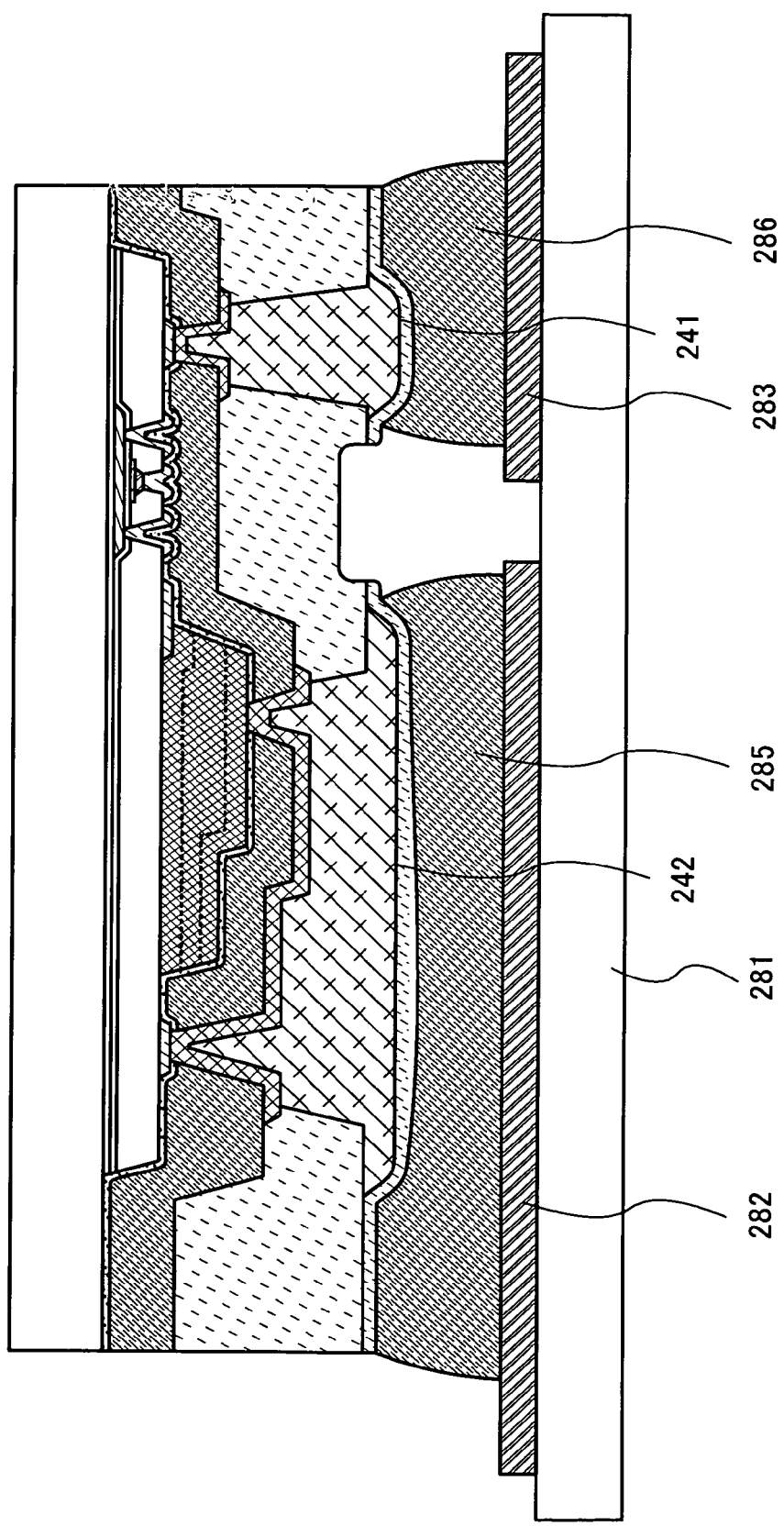
FIG. 23 is a cross-sectional view showing a manufacturing process of a photoelectric conversion element of the present invention.

Furthermore, the element is bonded to the printed circuit board 281 over which the electrodes 282 and 283 are formed (see FIG. 23). The element and the printed circuit board 281 are bonded to each other with use of solder as the conductive materials 285 and 286 so that the electrode 241 and the electrode 283 face each other and the electrode 242 and the electrode 282 face each other.

Note that even in the case where the slit 261 is not formed, similarly to FIG. 20, the bonding layer 271 may be formed after the electrodes are formed of, for example, copper (Cu) paste over the electrodes 241 and 242.

As for the semiconductor device including the photoelectric conversion element manufactured in this embodiment mode, the photoelectric conversion element and the printed circuit board which are included in the semiconductor device are bonded to each other more strongly; thus, the photoelectric conversion element and the printed circuit board are more difficult to separate than those in a conventional semiconductor device. Thus, the semiconductor device with high reliability is realized.

Hereinafter, a circuit configuration of the photoelectric conversion element of this embodiment mode is described with reference to FIG. 10, FIG. 11, and FIG. 12.

Figure 10:
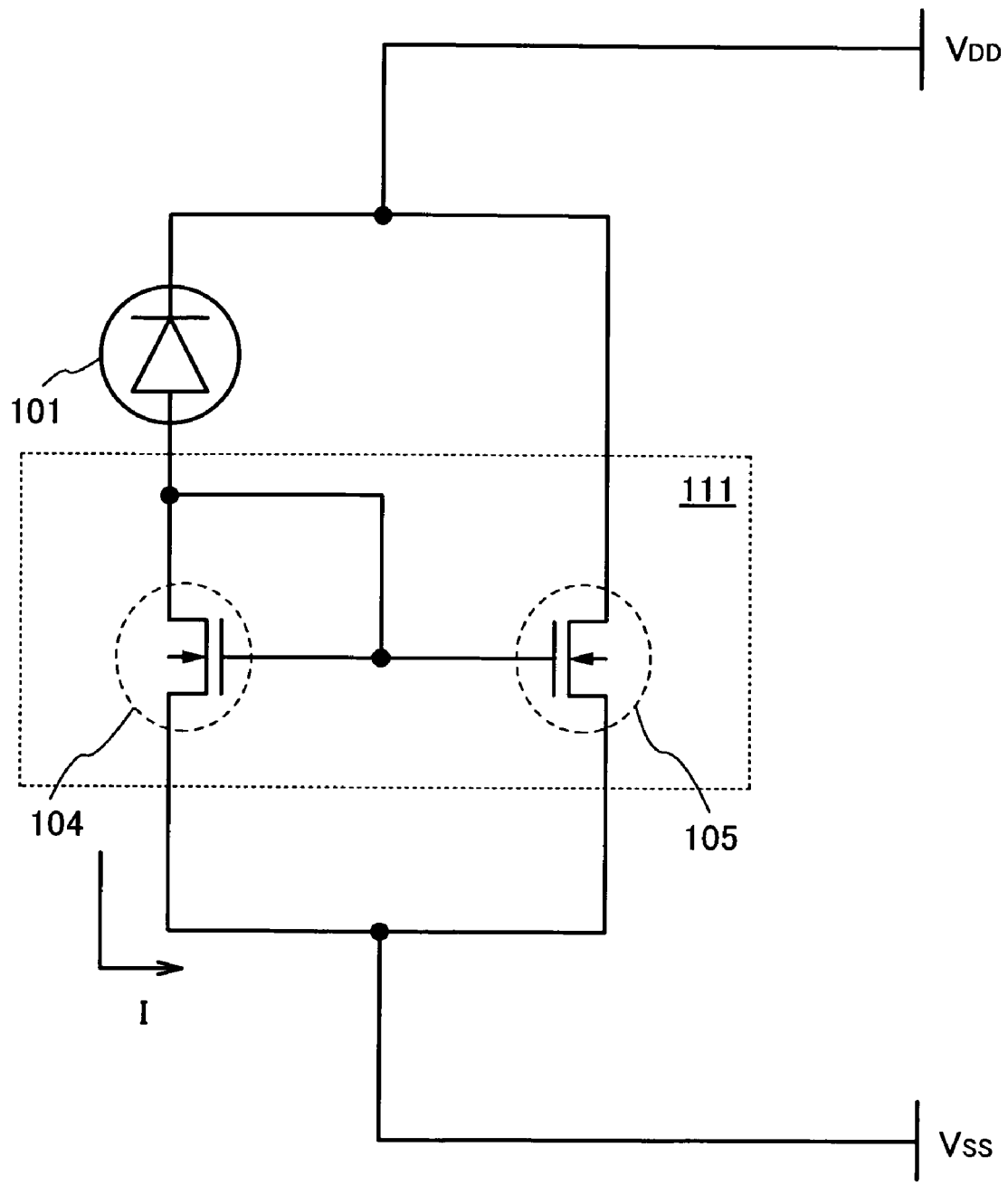
FIG. 10 is a circuit diagram of a photoelectric conversion element of the present invention.

FIG. 10 shows a circuit configuration of a photoelectric conversion element in the case of using the photodiode 101 including the photoelectric conversion layer 225 and, for example, a current mirror circuit 111 as an amplifier circuit configured to amplify the output of the photodiode 101. The current mirror circuit 111 includes a reference-side TFT 104 and an output-side TFT 105. Note that the above-described TFT 211 is either the TFT 104 or the TFT 105.

In FIG. 10, a gate electrode of the TFT 104 which constitutes a part of the current mirror circuit 111 is electrically connected to a gate electrode of the TFT 105 which also constitutes another part of the current mirror circuit 111, and furthermore, the gate electrode of the TFT 104 is electrically connected to a drain electrode (also referred to as a "drain terminal") which is one of a source electrode and the drain electrode of the TFT 104.

The drain terminal of the TFT 104 is electrically connected to the photodiode 101, the drain terminal of the TFT 105, and a high-potential power supply $V_{DD}$.

The source electrode (also referred to as "source terminal") which is the other of the source electrode and the drain electrode of the TFT 104 is electrically connected to a low-potential power supply $V_{SS}$ and a source terminal of the TFT 105.

In addition, the gate electrode of the TFT 105 which constitutes a part of the current mirror circuit 111 is electrically connected to the gate electrode and drain terminal of the TFT 104.

Since the gate electrodes of the TFT 104 and the TFT 105 are connected to each other, common potential is applied to the gate electrodes.

In FIG. 10, the example of the current mirror circuit constituted by two TFTs is shown. In this case, when the reference-side TFT 104 and the output-side TFT 105 have the same characteristics, the ratio between reference current and output current is 1:1.

Figure 11:
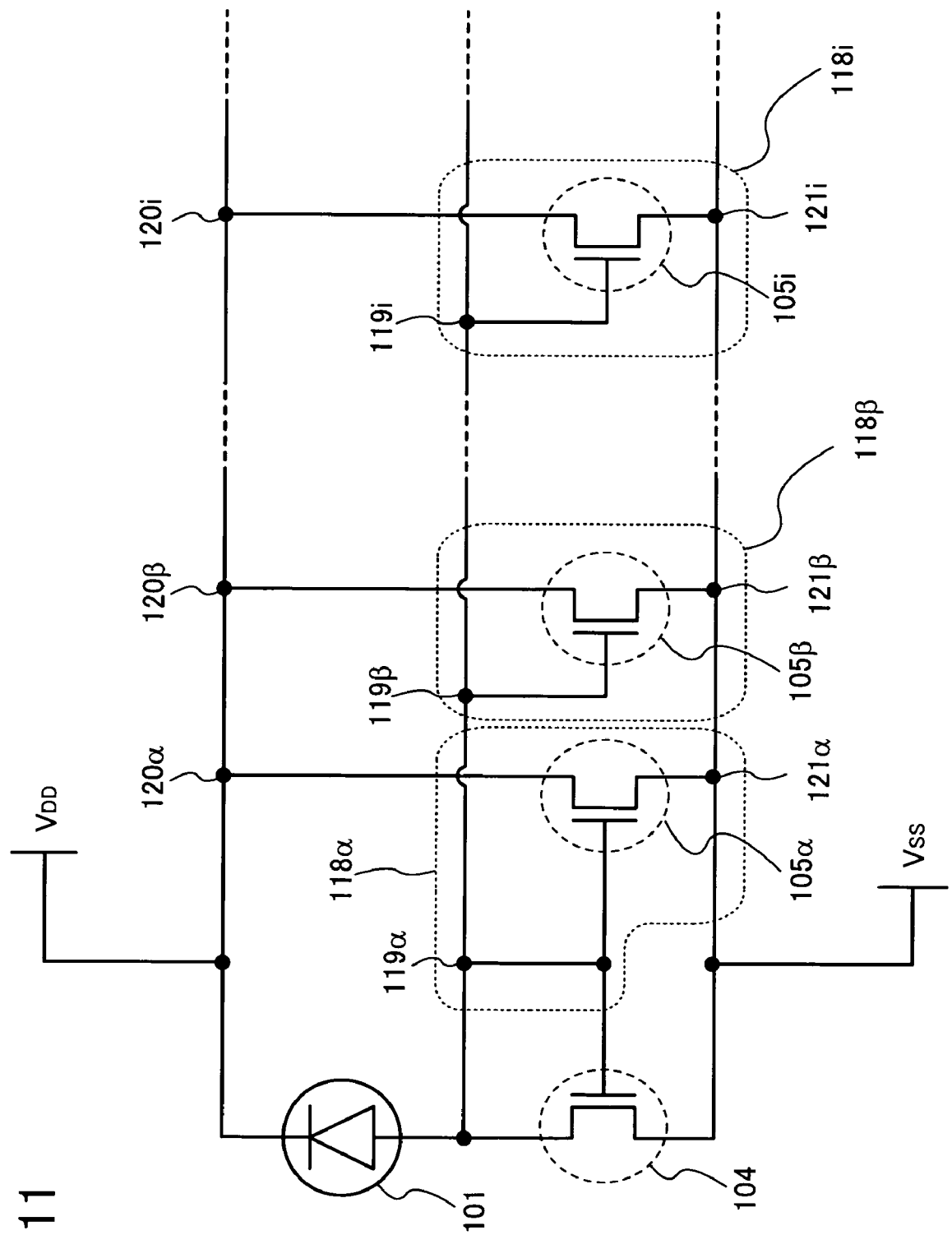
FIG. 11 is a circuit diagram of a photoelectric conversion element of the present invention.

FIG. 11 shows a circuit configuration for increasing the output value by n times. The circuit configuration of FIG. 11 corresponds to the configuration in which n pieces of TFT 105 shown in FIG. 10 are provided. The number ratio between the TFT 104 and the TFT 105 is set to 1:n as shown in FIG. 11, whereby the output value can be increased by n times. This is a similar principle to that which increases the channel width W of the TFT and increases the allowable amount of the current which can be passed through the TFT by n times.

For example, in the case where the output value is set to be increased by 100 times, one n-channel TFT 104 and 100 n-channel TFTs 105 are connected in parallel, whereby the target current can be obtained.

In FIG. 11, the current mirror circuit 111 includes the TFT 104, a circuit 118$i$ (any one of n pieces of circuit including a circuit 118α, a circuit 118β, and the like), a terminal 119$i$ (any one of n pieces of terminal including a terminal 119α, a terminal 119β, and the like), a terminal 120$i$ (any one of n pieces of terminal including a terminal 120α, a terminal 120β, and the like), and a terminal 121$i$ (any one of n pieces of terminal including a terminal 121α, a terminal 121β, and the like).

Note that as for the reference numerals in FIG. 11, the reference numerals with "i" are the same as those without "i" in FIG. 10. That is, for example, the TFT 105 in FIG. 10 is the same as the TFT 105$i$ in FIG. 11.

The circuit configuration of FIG. 11 is based on the circuit configurations of FIG. 10 and FIG. 11, and the same elements are denoted by the same reference numerals. That is, a gate electrode of the TFT 105$i$ is electrically connected to the terminal 119$i$ and also electrically connected to the terminal 120$i$. In addition, a source terminal of the TFT 105$i$ is electrically connected to the electrode 121$i$ which is the terminal.

Thus, in FIG. 11, the TFT 105 includes n pieces of TFT 105$i$. Accordingly, current flowing through the TFT 104 is amplified by n times and outputted.

That is, as described above, in the case where the ratio between the reference current and the output current is desired to be set to 1:1, one reference-side TFT and one output-side TFT are preferably formed, and FIG. 10 shows the circuit diagram of such a case. In the case where the ratio between the reference current and the output current is desired to be set to 1:n, one reference-side TFT and n pieces of output-side TFT are preferably formed. FIG. 11 shows the circuit diagram of this case.

FIG. 10 shows the current mirror circuit 111 as an equivalent circuit in which an n-channel TFT is used; however, a p-channel TFT may be used instead of the n-channel TFT.

Figure 12:
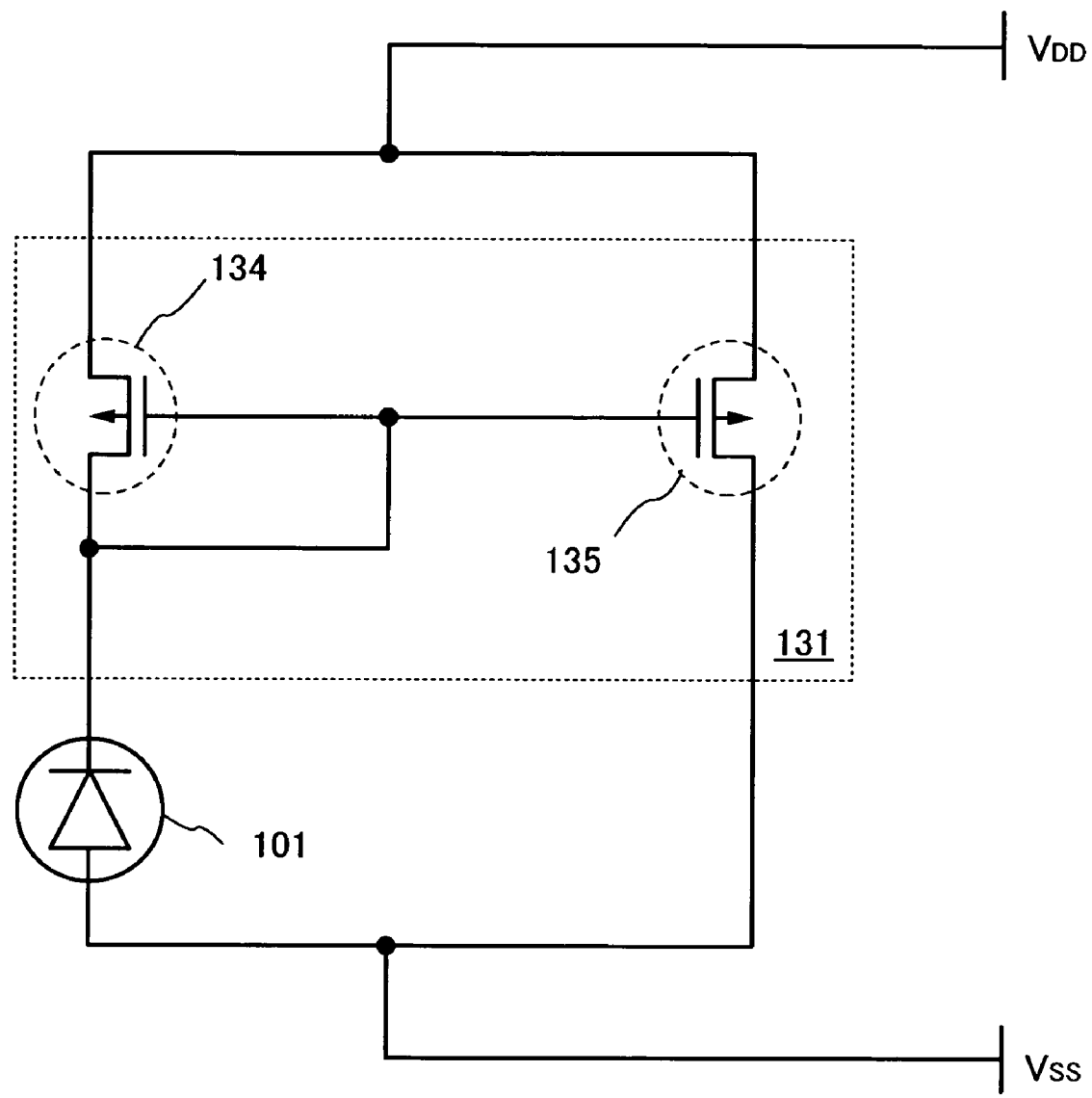
FIG. 12 is a circuit diagram of a photoelectric conversion element of the present invention.

In the case where a current mirror circuit 131 includes a p-channel TFT, an equivalent circuit shown in FIG. 12 is realized. As shown in FIG. 12, the current mirror circuit 131 includes p-channel TFTs 134 and 135. Note that the same components are denoted by the same reference numerals as those in FIG. 10, FIG. 11, and FIG. 12.

In the case where the ratio between the reference current and the output current of the current mirror circuit 131 is desired to be set to 1:n, similarly to FIG. 11, n pieces of the output-side TFT 135 are preferably provided.

Figure 13:
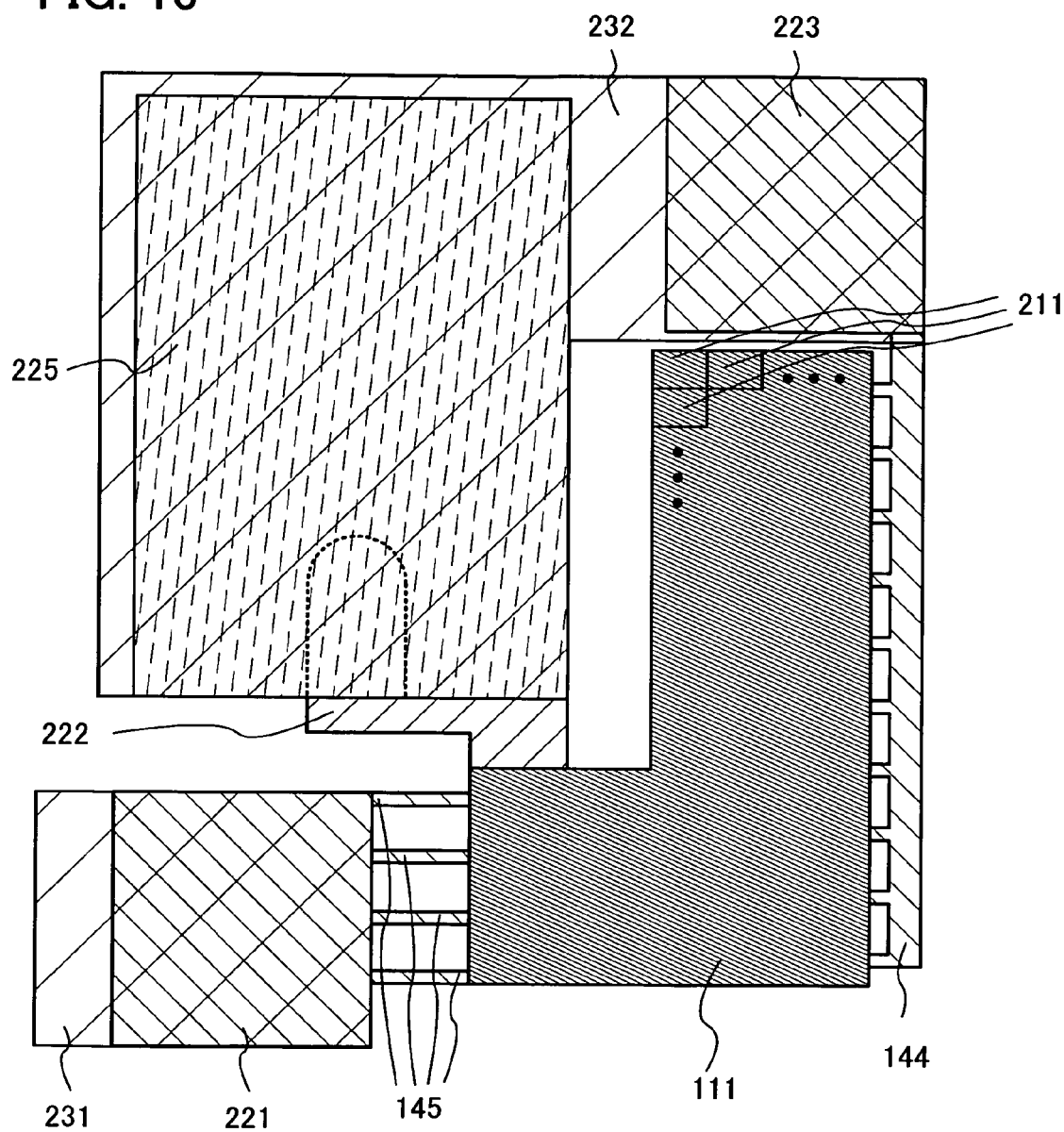
FIG. 13 is a top view of a photoelectric conversion element of the present invention.
Figure 14:
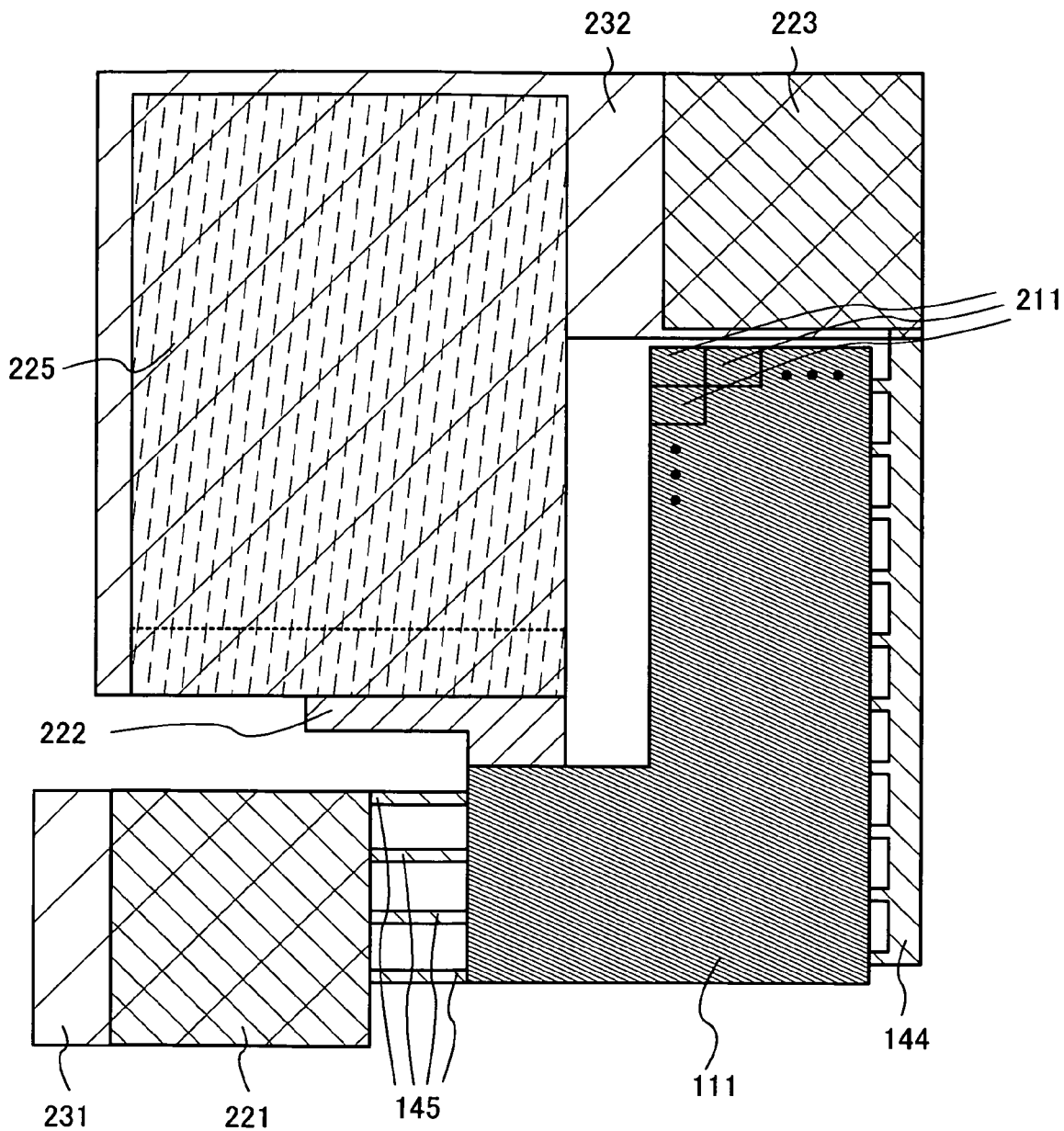
FIG. 14 is a top view of a photoelectric conversion element of the present invention.

Each of FIG. 13 and FIG. 14 is a top view of the photoelectric conversion element shown in each of FIG. 10 and FIG. 7B.

The current mirror circuit 111 is electrically connected to the electrode 223 which is electrically connected to the high-potential power supply $V_{DD}$, through a wiring 144. In addition, the current mirror circuit 111 is electrically connected to the electrode 221 which is electrically connected to the low-potential power supply $V_{SS}$, through wirings 145.

The electrode 232 covers the whole photoelectric conversion layer 225, and accordingly, electrostatic breakdown can be prevented. Note that the electrode 232 may be formed so as to overlap with part of the photoelectric conversion layer 225, according to need.

Although the edge of the electrode 222 is formed into a semicircular shape in FIG. 13, a region of the electrode 222, which overlaps with the photoelectric conversion layer 225, may be formed into a rectangular shape as shown in FIG. 14. This makes it possible to suppress electric field concentration, and accordingly, electrostatic breakdown can be prevented.

As described above, the present invention makes it possible to provide a semiconductor device including a photoelectric conversion element with high reliability.

Embodiment Mode 2

In this embodiment mode, examples in which the photoelectric conversion element obtained in Embodiment Mode 1 is incorporated in various electronic appliances will be described. As examples of the electronic appliances described in this embodiment mode, computers, displays, cellular phones, TV sets are given. Specific examples of the electronic appliances are shown in FIG. 15, FIGS. 16A and 16B, FIGS. 17A and 17B, FIG. 18, and FIGS. 19A and 19B.

Figure 15:
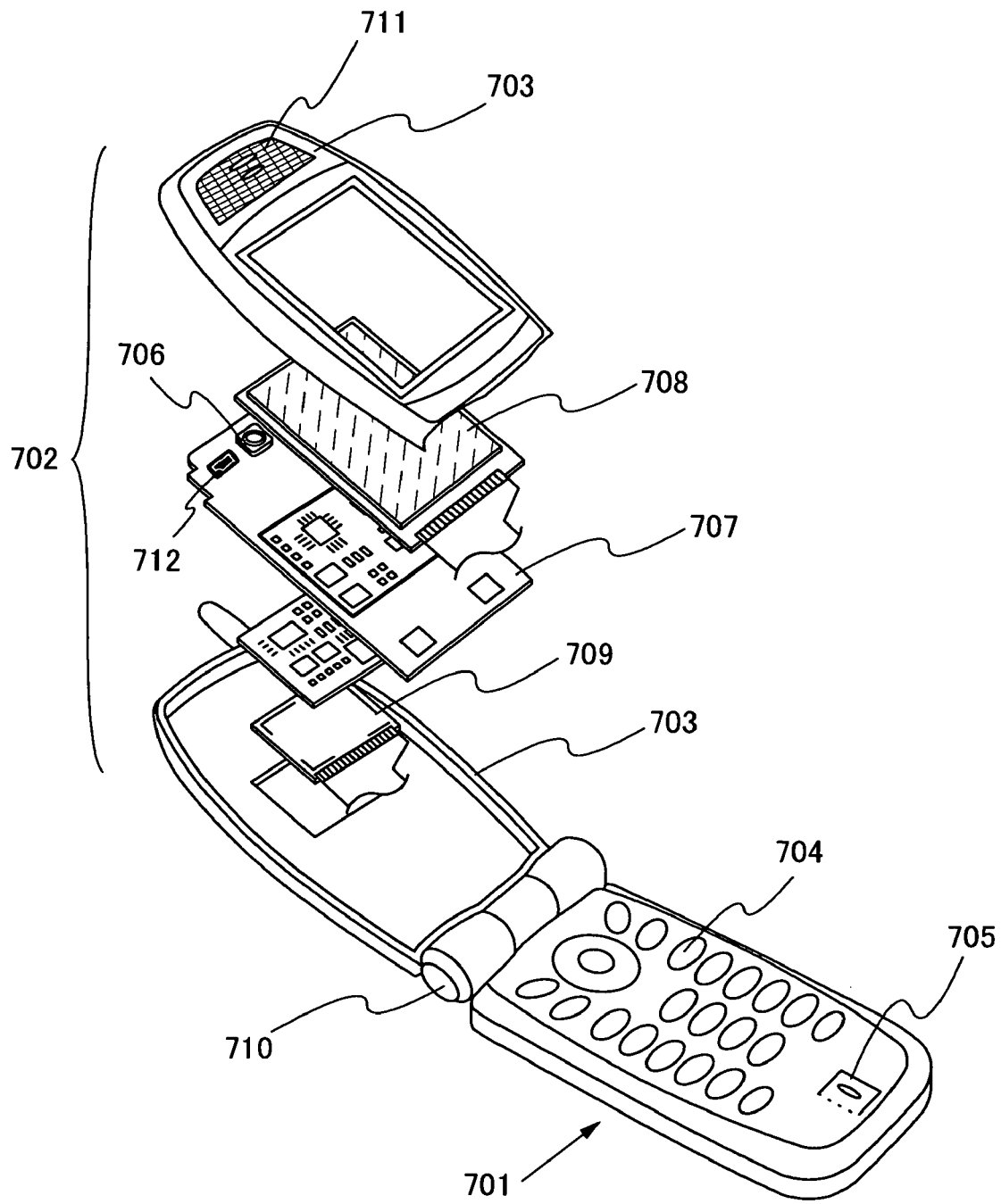
FIG. 15 is a diagram showing a device mounted with a semiconductor device of the present invention.

FIG. 15 shows a cellular phone, which includes a main body A 701, a main body B 702, a chassis 703, operation keys 704, an audio input portion 705, an audio output portion 706, a circuit board 707, a display panel A 708, a display panel B 709, a hinge 710, a light-transmitting material portion 711, and a photoelectric conversion element 712 obtained in Embodiment Mode 1.

The photoelectric conversion element 712 detects light which is passed through the light-transmitting material portion 711 and controls luminance of the display panel A 708 and the display panel B 709 depending on the illuminance of the detected extraneous light or controls illumination of the operation keys 704 depending on the illuminance obtained by the photoelectric conversion element 712. In this manner, current consumption of the cellular phone can be suppressed.

Figure 16A:
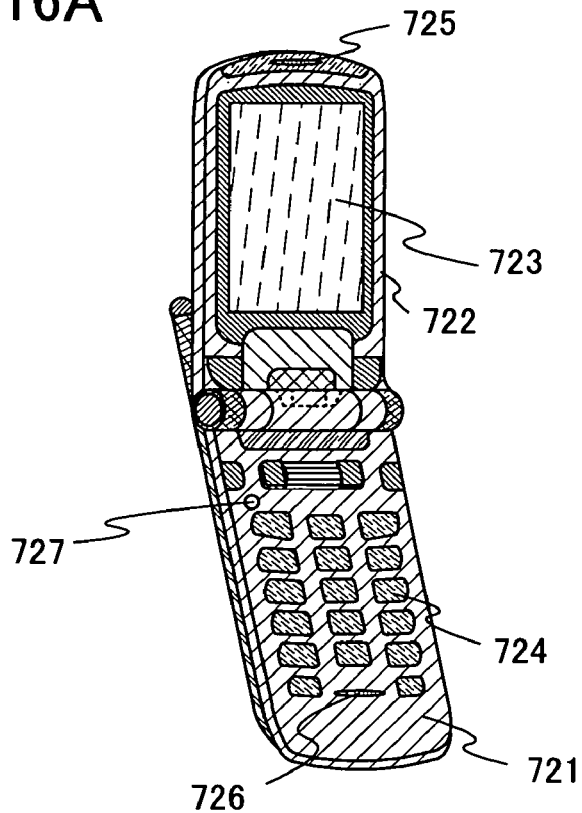
FIGS. 16A and 16B are diagrams each showing a device mounted with a semiconductor device of the present invention.
Figure 16B:
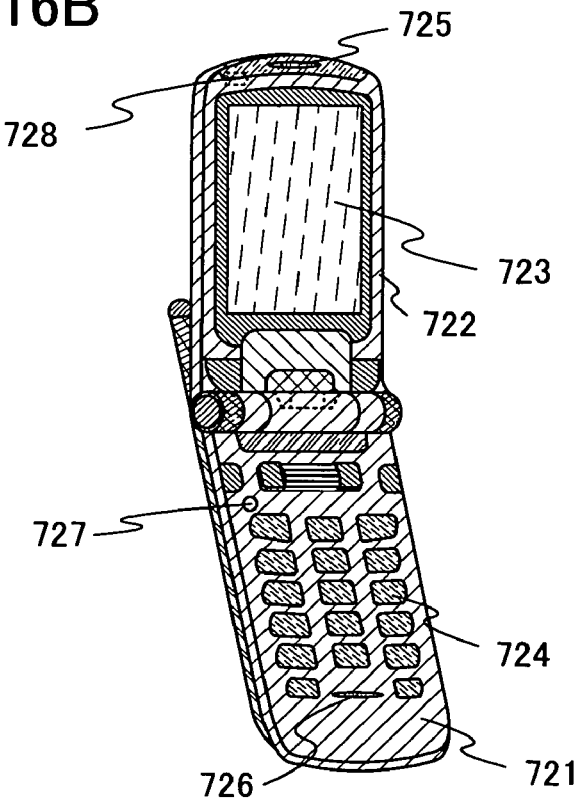

FIGS. 16A and 16B show other examples of cellular phones. In FIGS. 16A and 16B, the cellular phone includes a main body 721, a chassis 722, a display panel 723, operation keys 724, an audio output portion 725, an audio input portion 726, and photoelectric conversion elements 727 and 728 obtained in Embodiment Mode 1.

In the cellular phone shown in FIG. 16A, extraneous light is detected by the photoelectric conversion element 727 provided in the main body 721, whereby luminance of the display panel 723 and the operation keys 724 can be controlled.

In the cellular phone shown in FIG. 16B, the photoelectric conversion element 728 is provided inside the main body 721 in addition to the structure shown in FIG. 16A. By the photoelectric conversion element 728, luminance of a backlight provided in the display panel 723 can also be detected.

Figure 17A:
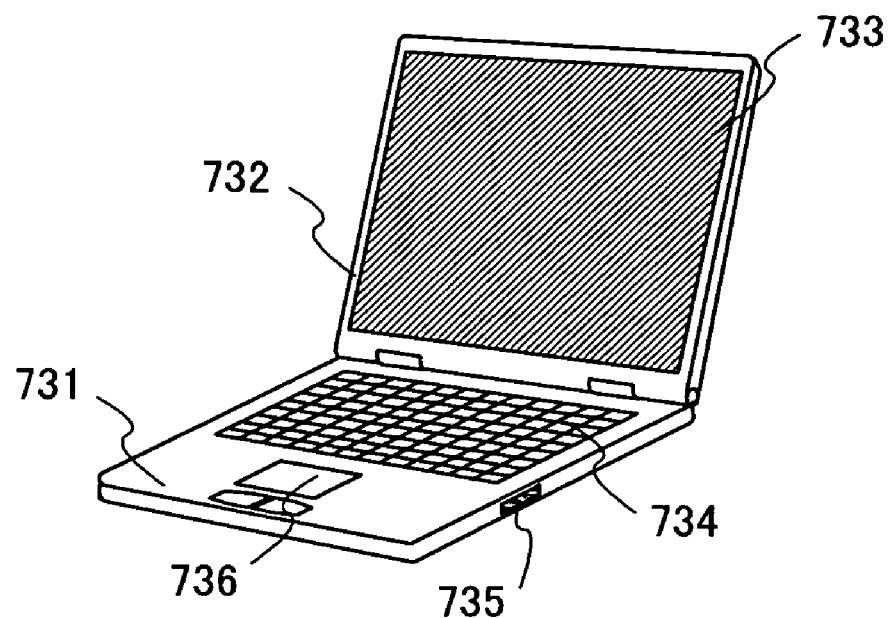
FIGS. 17A and 17B are diagrams each showing a device mounted with a semiconductor device of the present invention.

FIG. 17A shows a computer, which includes a main body 731, a chassis 732, a display portion 733, a keyboard 734, an external connection port 735, a pointing device 736, and the like.

Figure 17B:
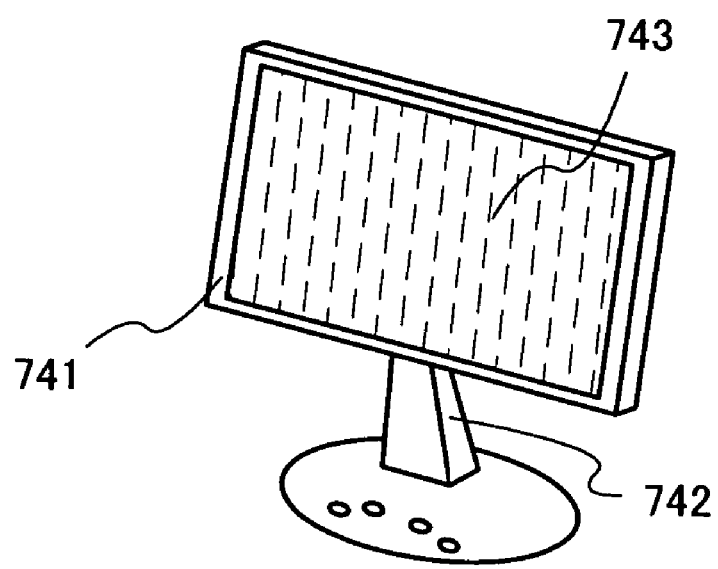

FIG. 17B shows a display device, and a television receiver corresponds to the display device. The display device includes a chassis 741, a support 742, a display portion 743, and the like.

FIG. 18 shows a detailed structure of a case where a liquid crystal panel is used for the display portion 733 of the computer shown in FIG. 17A and the display portion 743 of the display device shown in FIG. 17B.

A liquid crystal panel 762 shown in FIG. 18 is incorporated in a chassis 761 and includes substrates 751a and 751b, a liquid crystal layer 752 interposed between the substrates 751a and 751b, polarizing filters 755a and 755b, a backlight 753, and the like. In addition, a formation region 754 of the photoelectric conversion element including the photoelectric conversion element obtained in Embodiment Mode 1 is formed in the chassis 761.

In the formation region 754 of the photoelectric conversion element, the amount of light from the backlight 753 is detected, and the information regarding the amount of light and the like is fed back, whereby the luminance of the liquid crystal panel 762 is adjusted.

Figure 19A:
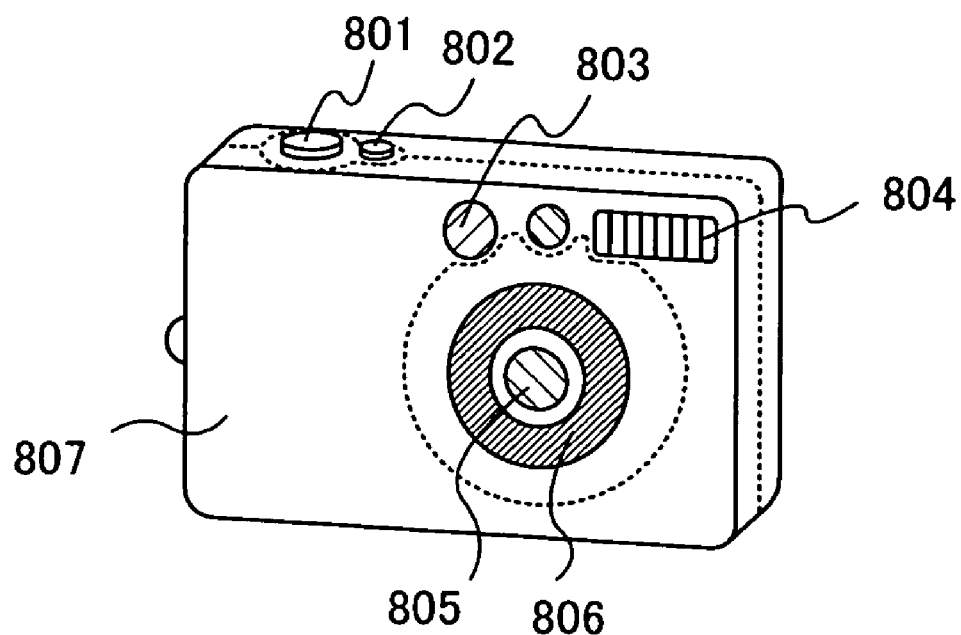
FIGS. 19A and 19B are diagrams showing a device mounted with a semiconductor device of the present invention.
Figure 19B:
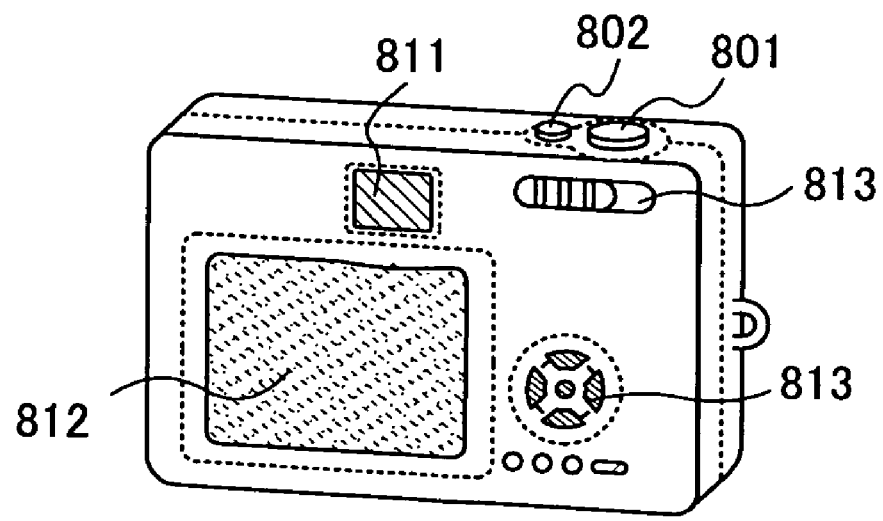

FIGS. 19A and 19B are views showing an example in which a photoelectric conversion element is incorporated in a camera, for example, a digital camera. FIG. 19A is a perspective view seen from the front side of the digital camera, and FIG. 19B is a perspective view seen from the back side of the digital camera.

In FIG. 19A, the digital camera is provided with a release button 801, a main switch 802, a viewfinder 803, a flash portion 804, a lens 805, a barrel 806, and a chassis 807.

In FIG. 19B, the digital camera is provided with an eyepiece finder 811, a monitor 812, and operation buttons 813.

When the release button 801 is pushed down to the half point, a focus adjustment mechanism and an exposure adjustment mechanism are operated. When the release button 801 is pushed down to the lowest point, a shutter is opened.

The main switch 802 is pushed down or rotated, whereby a power supply of the digital camera is switched on or off.

The viewfinder 803 is located above the lens 805, which is on the front side of the digital camera, for checking a shooting range and the focus point from the eyepiece finder 811 shown in FIG. 19B.

The flash portion 804 is located in the upper position on the front side of the digital camera. When the luminance of a subject is not sufficient, auxiliary light is emitted from the flash portion 804, at the same time as the release button is pushed down and the shutter is opened.

The lens 805 is located at the front side of the digital camera and includes a focusing lens, a zoom lens, and the like. The lens forms a photographic optical system with a shutter button and a diaphragm which are not shown. In addition, behind the lens, an imaging device such as a CCD (charge coupled device) is provided.

The barrel 806 moves a lens position to adjust the focus of the focusing lens, the zoom lens, and the like. In shooting, the barrel is slid out so that the lens 805 moves forward. Further, when carrying the digital camera, the lens 805 is moved backward to be compact. Note that a structure is employed in this embodiment, in which the barrel is slid out, whereby the subject can be photographed by zoom; however, the present invention is not limited to this structure. A structure may also be employed for the digital camera, in which shooting can be performed by zoom without sliding out the barrel with use of a structure of a photographic optical system inside the chassis 807.

The eyepiece finder 811 is located in the upper position on the back side of the digital camera for looking therethrough in checking a shooting range and a focus point.

The operation buttons 813 are buttons for various functions provided on the back side of the digital camera, which includes a set up button, a menu button, a display button, a function button, a selection button, and the like.

When the photoelectric conversion element obtained in Embodiment Mode 1 is incorporated in the camera shown in FIGS. 19A and 19B, the photoelectric conversion element can detect whether light exists or not and light intensity, and accordingly, exposure adjustment of a camera, or the like can be performed.

In addition, the photoelectric conversion element obtained in Embodiment Mode 1 can also be applied to other electronic appliances such as projection TV sets and navigation systems. In other words, the photoelectric conversion element can be applied to any object as long as the object needs to detect light.

This application is based on Japanese Patent Application no. 2007-108795 filed with Japan Patent Office on Apr. 18, 2007, the entire contents of which are hereby incorporated by reference.

What is claimed is:
1. A semiconductor device comprising:
a photoelectric conversion layer formed over a substrate;
an amplifier circuit including at least two thin film transistors, wherein the amplifier circuit is formed over the substrate and is configured to amplify output current of the photoelectric conversion layer;

a first interlayer insulating film formed over the photoelectric conversion layer and the amplifier circuit;

a first electrode formed over the photoelectric conversion layer and the first interlayer insulating film, wherein the first electrode is electrically connected to the photoelectric conversion layer;

a second interlayer insulating film formed over the first interlayer insulating film, wherein the second interlayer insulting film overlaps the amplifier circuit and has an opening that reaches the first electrode;

a second electrode formed in the opening, wherein the second electrode is electrically connected to the first electrode; and a bonding layer formed over the second electrode, wherein the bonding layer overlaps the second interlayer insulating film and the second electrode, wherein the bonding layer contains a metal which is capable of forming an alloy with solder.

2. The semiconductor device according to claim 1, wherein the bonding layer contains an element selected from the group consisting of nickel, copper, zinc, palladium, silver, tin, platinum, and gold.

3. The semiconductor device according to claim 1, wherein the amplifier circuit is a current mirror circuit.

4. The semiconductor device according to claim 1, further comprising a protective film between the photoelectric conversion layer and the first interlayer insulating film.

5. The semiconductor device according to claim 1, wherein the photoelectric conversion layer comprises a p-type semiconductor layer, an i-type semiconductor layer, and an n-type semiconductor layer.

6. The semiconductor device according to claim 1, wherein the second electrode contains nickel.

7. The semiconductor device according to claim 1, wherein the bonding layer is a stacked layer formed of a gold layer, a nickel layer, and a titanium layer.

8. A semiconductor device comprising:

a photoelectric conversion layer formed over a first substrate;

an amplifier circuit including at least two thin film transistors, wherein the amplifier circuit is formed over the first substrate and is configured to amplify output current of the photoelectric conversion layer;

a first interlayer insulating film formed over the photoelectric conversion layer and the amplifier circuit;

a first electrode formed over the photoelectric conversion layer and the first interlayer insulating film, wherein the first electrode is electrically connected to the photoelectric conversion layer;

a second interlayer insulating film formed over the first interlayer insulating film, wherein the second interlayer insulting film overlaps the amplifier circuit and has an opening that reaches the first electrode;

a second electrode formed in the opening, wherein the second electrode is electrically connected to the first electrode;

a bonding layer formed over the second electrode, wherein the bonding layer overlaps the second interlayer insulating film and the second electrode;

a conductive material formed over the bonding layer, wherein the conductive material is electrically connected to the bonding layer;

a third electrode formed over the conductive material, wherein the third electrode is electrically connected to the conductive material; and a second substrate formed over the third electrode, wherein the bonding layer contains a metal which is capable of forming an alloy with solder.

9. The semiconductor device according to claim 8, wherein the bonding layer contains an element selected from the group consisting of nickel, copper, zinc, palladium, silver, tin, platinum, and gold.

10. The semiconductor device according to claim 8, wherein the amplifier circuit is a current mirror circuit.

11. The semiconductor device according to claim 8, further comprising a protective film between the photoelectric conversion layer and the first interlayer insulating film.

12. The semiconductor device according to claim 8, wherein the photoelectric conversion layer comprises a p-type semiconductor layer, an i-type semiconductor layer, and an n-type semiconductor layer.

13. The semiconductor device according to claim 8, wherein the second electrode contains nickel.

14. The semiconductor device according to claim 8, wherein the bonding layer is a stacked layer formed of a gold layer, a nickel layer, and a titanium layer.

15. The semiconductor device according to claim 8, wherein the conductive material contains solder.

16. The semiconductor device according to claim 8, wherein the second substrate is a printed circuit board.

17. A semiconductor device comprising:

a photoelectric conversion layer formed over a first substrate;

an amplifier circuit including at least two thin film transistors, wherein the amplifier circuit is formed over the first substrate and is configured to amplify output current of the photoelectric conversion layer;

a first interlayer insulating film formed over the photoelectric conversion layer and the amplifier circuit;

a first electrode formed over the photoelectric conversion layer and the first interlayer insulating film, wherein the first electrode is electrically connected to the photoelectric conversion layer;

a second interlayer insulating film formed over the first interlayer insulating film, wherein the second interlayer insulting film overlaps the amplifier circuit and has an opening that reaches the first electrode;

a second electrode formed in the opening, wherein the second electrode is electrically connected to the first electrode;

a third electrode formed over the second electrode, wherein the third electrode overlaps the second electrode and the second interlayer insulating film and is electrically connected to the second electrode;

a bonding layer formed over the third electrode, wherein the bonding layer overlaps the second interlayer insulating film and the third electrode and is electrically connected to the third electrode;

a conductive material formed over the bonding layer, wherein the conductive material is electrically connected to the bonding layer;

a fourth electrode formed over the conductive material, wherein the fourth electrode is electrically connected to the conductive material; and a second substrate formed over the fourth electrode, wherein the bonding layer contains a metal which is capable of forming an alloy with solder.

18. The semiconductor device according to claim 17, wherein the bonding layer contains an element selected from the group consisting of nickel, copper, zinc, palladium, silver, tin, platinum, and gold.

19. The semiconductor device according to claim 17, wherein the amplifier circuit is a current mirror circuit.

20. The semiconductor device according to claim 17, further comprising a protective film between the photoelectric conversion layer and the first interlayer insulating film.

21. The semiconductor device according to claim 17, wherein the photoelectric conversion layer comprises a p-type semiconductor layer, an i-type semiconductor layer, and an n-type semiconductor layer.

22. The semiconductor device according to claim 17, wherein the second electrode contains nickel.

23. The semiconductor device according to claim 17, wherein the conductive material contains solder.

24. The semiconductor device according to claim 17, wherein the second substrate is a printed circuit board.

25. The semiconductor device according to claim 17, wherein the bonding layer is a stacked layer formed of a gold layer, a nickel layer, and a titanium layer.

* * * * *